United States Patent
Itai et al.

(10) Patent No.: US 9,805,780 B2
(45) Date of Patent: Oct. 31, 2017

(54) NONVOLATILE MEMORY WITH MAGNETORESISTIVE ELEMENT AND TRANSISTOR

(71) Applicant: KABUSHIKI KAISHA TOSHIBA, Tokyo (JP)

(72) Inventors: Shogo Itai, Kanagawa (JP); Hiroki Noguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/267,715

(22) Filed: Sep. 16, 2016

(65) Prior Publication Data
US 2017/0103792 A1    Apr. 13, 2017

Related U.S. Application Data

(63) Continuation of application No. PCT/JP2015/076937, filed on Sep. 24, 2015.

(51) Int. Cl.
*G11C 5/08* (2006.01)
*G11C 11/16* (2006.01)
(Continued)

(52) U.S. Cl.
CPC ............ *G11C 11/161* (2013.01); *G11C 11/16* (2013.01); *G11C 11/1673* (2013.01);
(Continued)

(58) Field of Classification Search
CPC ... G11C 11/16; G11C 11/161; G11C 11/1697; G11C 11/1673; G11C 11/1675; G11C 11/1695
(Continued)

(56) References Cited

U.S. PATENT DOCUMENTS 7,885,095 B2    2/2011  Sakimura et al.
8,514,614 B2    8/2013  Shimizu et al.
(Continued)

FOREIGN PATENT DOCUMENTS

JP    2006-344256    12/2006
JP    2008-112525    5/2008
(Continued)

OTHER PUBLICATIONS

International Search Report issued by the Japanese Patent Office in International Application No. PCT/JP2015/076937, dated Nov. 2, 2015 (1 page).

(Continued)

*Primary Examiner* — Gene Auduong
(74) *Attorney, Agent, or Firm* — Finnegan, Henderson, Farabow, Garrett & Dunner, L.L.P.

(57) ABSTRACT

A nonvolatile memory of an embodiment includes: first through fifth wirings; and a memory cell including: a first circuit including a first magnetoresistive element and a first select transistor, the first magnetoresistive element and the first select transistor being electrically connected in series, the first magnetoresistive element including a first reference layer, a first storage layer, and a first nonmagnetic layer between the first reference layer and the first storage layer; a second circuit including a second magnetoresistive element and a second select transistor, the second magnetoresistive element and the second select transistor being electrically connected in series, the second magnetoresistive element including a second reference layer, a second storage layer, and a second nonmagnetic layer between the second reference layer and the second storage layer; a third circuit including first and second transistors; and a fourth circuit including third and fourth transistors.

10 Claims, 14 Drawing Sheets

(51) Int. Cl.
    *H01L 43/02*     (2006.01)
    *H01L 43/08*     (2006.01)
    *H01L 27/22*     (2006.01)

(52) U.S. Cl.
    CPC ........ *G11C 11/1697* (2013.01); *H01L 27/226* (2013.01); *H01L 43/02* (2013.01); *H01L 43/08* (2013.01)

(58) Field of Classification Search
    USPC .................. 365/63, 66, 100, 148, 158, 171
    See application file for complete search history.

(56) References Cited

U.S. PATENT DOCUMENTS

| | | | | |
|---|---|---|---|---|
| 9,082,497 | B2* | 7/2015 | Suzuki | H01L 27/228 |
| 9,196,338 | B2* | 11/2015 | Kawasumi | G11C 11/1673 |
| 9,343,129 | B2 | 5/2016 | Shimomura | |
| 9,508,923 | B2* | 11/2016 | Suzuki | H01L 27/228 |
| 2006/0274573 | A1 | 12/2006 | Iwata | |
| 2010/0220517 | A1* | 9/2010 | Okayama | G11C 7/20 365/158 |
| 2010/0238711 | A1 | 9/2010 | Asao | |
| 2013/0223135 | A1* | 8/2013 | Koyama | G11C 11/412 365/149 |
| 2016/0380184 | A1* | 12/2016 | Kato | H01L 43/08 257/421 |
| 2017/0178706 | A1* | 6/2017 | Noguchi | G11C 11/1673 |

FOREIGN PATENT DOCUMENTS

| | | |
|---|---|---|
| JP | 2010-113766 | 5/2010 |
| JP | 2010-225224 | 10/2010 |
| JP | 2011-65718 | 3/2011 |
| JP | 5045672 | 10/2012 |
| JP | 2013-201220 | 10/2013 |
| JP | 5565704 | 8/2014 |
| WO | WO 2007/142138 A1 | 12/2007 |
| WO | WO 2010/047328 A1 | 4/2010 |
| WO | WO 2015/129056 A1 | 9/2015 |

OTHER PUBLICATIONS

English translation of the International Preliminary Report on Patentability issued by the Internal Bureau of WIPO dated Mar. 30, 2017, in counterpart International Application No. PCT/JP2015/076937.

* cited by examiner

NONVOLATILE MEMORY WITH MAGNETORESISTIVE ELEMENT AND TRANSISTOR

CROSS REFERENCE TO RELATED APPLICATIONS

This application is a continuation of International Application No. PCT/JP2015/076937, filed on Sep. 24, 2015, which is based upon and claims the benefit of priority from the prior Japanese Patent Application No. 2014-192020, filed on Sep. 19, 2014, the entire contents of which are incorporated herein by reference.

FIELD

Embodiments described herein relate generally to nonvolatile memories.

BACKGROUND

A magnetic resistance random access memory of a spin transfer torque magnetization switching type (hereinafter also referred to as a spin transfer torque magnetic random access memory (STT-MRAM) is a candidate nonvolatile memory to be used in a technology that is required to consume less power, such as a processor to be used in a handheld terminal.

A memory cell in a STT-MRAM normally includes a magnetic tunnel junction (MTJ) element that includes: a storage layer including a magnetic film that has a changeable magnetization direction; a reference layer including a magnetic film that has a fixed magnetization direction; and a nonmagnetic layer (a tunnel barrier layer, for example) interposed between the storage layer and the reference layer. The memory cell also includes a select transistor. In the MTJ element, the electrical resistance between the storage layer and the reference layer varies depending on whether the magnetization directions of the storage layer and the reference layer are in a parallel state (P), or whether the magnetization directions are in an antiparallel state (AP). The electrical resistance between the storage layer and the reference layer is low in the parallel state, and is high in the antiparallel state. One of the parallel state and the antiparallel state is associated with information "0", and the other is associated with information "1". When the magnetization direction of the storage layer is to be switched from the antiparallel state to the parallel state relative to the magnetization direction of the reference layer, electrons flow from the reference layer to the storage layer via the nonmagnetic layer. When the magnetization direction of the storage layer is to be switched from the parallel state to the antiparallel state relative to the magnetization direction of the reference layer, electrons flow from the storage layer to the reference layer via the nonmagnetic layer.

One of the storage layer and the reference layer is connected to one of the source and the drain of the select transistor. The other one of the storage layer and the reference layer is connected to a bit line BL. The other one of the source and the drain of the select transistor is connected to a source line SL, and the gate of the select transistor is connected to a word line WL.

In a write operation in this memory cell including the select transistor and the MTJ element, current is applied from the source line SL to the bit line BL, or current is applied from the bit line BL to the source line SL, so that the resistance state of the MTJ element is switched from a high-resistance state to a low-resistance state or from a low-resistance state to a high-resistance state, and information "0" or information "1" is recorded.

Meanwhile, in a read operation in the above described memory cell, a read current is applied from one line to the other between the source line SL and the bit line BL, or from the source line SL to the bit line BL, for example, and the resistance value of the MTJ element at that time is read through the current value or the voltage value. In an example case, the storage layer of the MTJ element is connected to the bit line BL, the reference layer is connected to one of the source and the drain of the select transistor, the other one of the source and the drain is connected to the source line SL, and the magnetization direction of the storage layer is parallel (P) to the magnetization direction of the reference layer. In this case, when the read current is applied from the source line SL to the bit line BL, the current direction is the same as that in a case where an antiparallel state (AP) is written into the storage layer, and a wrong write might be performed.

In another example case, the reference layer of the MTJ element is connected to the bit line BL, the storage layer is connected to one of the source and the drain of the select transistor, the other one of the source and the drain is connected to the source line SL, and the magnetization direction of the storage layer is antiparallel (AP) to the magnetization direction of the reference layer. In this case, when the read current is applied from the source line SL to the bit line BL, the current direction is the same as that in a case where a parallel state (P) is written into the storage layer, and a wrong write might be performed.

Such a wrong write becomes conspicuous particularly in a case where the difference in current amount between a read operation and a write operation is smaller, such as a case where the read current is increased to speed up operation or a case where an element to reduce the write current is used. As a result, such a wrong write hinders improvement in the performance of the STT-MRAM.

DETAILED DESCRIPTION

A nonvolatile memory according to an embodiment includes: first through fifth wirings; and a memory cell including: a first circuit including a first magnetoresistive element and a first select transistor, the first magnetoresistive element and the first select transistor being electrically connected in series, the first magnetoresistive element including a first reference layer, a first storage layer, and a first nonmagnetic layer between the first reference layer and the first storage layer; a second circuit including a second magnetoresistive element and a second select transistor, the second magnetoresistive element and the second select transistor being electrically connected in series, the second magnetoresistive element including a second reference layer, a second storage layer, and a second nonmagnetic layer between the second reference layer and the second storage layer; a third circuit including first and second transistors; and a fourth circuit including third and fourth transistors, wherein gates of the first and second select transistors are electrically connected to the first wiring, one terminal of the first circuit and a gate of one of the third and fourth transistors of the fourth circuit are electrically connected to the second wiring, one terminal of the second circuit and a gate of one of the first and second transistors of the third circuit are electrically connected to the third wiring, the other terminal of the first circuit and a gate of the other one of the third and fourth transistors of the fourth circuit are electrically connected to the fourth wiring, and the other terminal of the second circuit and a gate of the other one of the first and second transistors of the third circuit are electrically connected to the fifth wiring.

Embodiments will now be described with reference to the accompanying drawings.

First Embodiment

Figure 1:
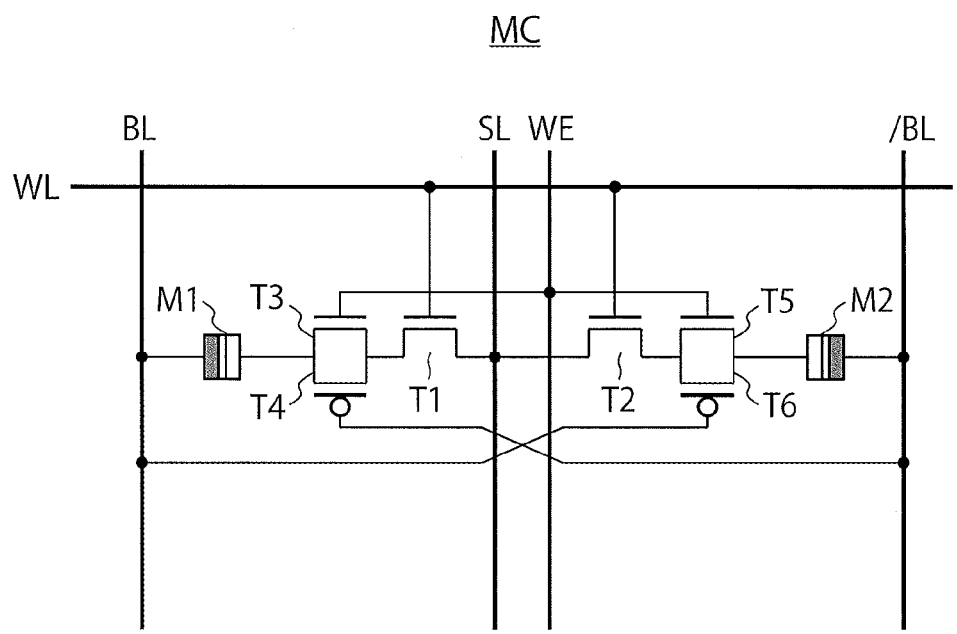
FIG. 1 is a circuit diagram showing a memory cell of a nonvolatile memory according to a first embodiment.

Referring to FIG. 1, a nonvolatile memory according to a first embodiment is described. The nonvolatile memory of the first embodiment includes memory cells arranged in a matrix fashion, and each of the memory cells has the structure shown in FIG. 1. A memory cell MC includes first and second magnetoresistive elements (first and second MTJ elements, for example) M1 and M2, first and second select transistors T1 and T2 formed with n-channel MOS transistors, and a wrong write preventing circuit. This wrong write preventing circuit includes first and second CMOS switches. The first CMOS switch is formed with an n-channel MOS transistor T3 and a p-channel MOS transistor T4, and the second CMOS switch is formed with an n-channel MOS transistor T5 and a p-channel MOS transistor T6. One of the source and the drain of the n-channel MOS transistor T3 is connected to one of the source and the drain of the p-channel MOS transistor T4, and the other one of the source and the drain of the n-channel MOS transistor T3 is connected to the other one of the source and the drain of the p-channel MOS transistor T4. Meanwhile, one of the source and the drain of the n-channel MOS transistor T5 is connected to one of the source and the drain of the p-channel MOS transistor T6, and the other one of the source and the drain of the n-channel MOS transistor T5 is connected to the other one of the source and the drain of the p-channel MOS transistor T6.

In the nonvolatile memory of this embodiment, a pair of bit lines BL and /BL, a source line SL, and a write enable line WE are provided for each column of the memory cells. A word line WL is provided for each row of the memory cells.

The first MTJ element M1, the first CMOS switch, and the first select transistor T1 are connected in series between the bit line BL and the source line SL provided for the column to which the memory cell MC belongs. The second MTJ element M2, the second CMOS switch, and the second select transistor T2 are connected in series between the bit line /BL and the source line SL provided for the column to which the memory cell MC belongs. The respective gates of the first and second select transistors T1 and T2 are connected to the word line WL. The gate of the n-channel MOS transistor T3 of the first CMOS switch and the gate of the n-channel MOS transistor T5 of the second CMOS switch are connected to the write enable line WE. The gate of the p-channel MOS transistor T4 of the first CMOS switch is connected to the bit line /BL, and the gate of the p-channel MOS transistor T6 of the second CMOS switch is connected to the bit line BL.

In each of the memory cells MC of the first embodiment and the modifications described later, the components of the memory cell are arranged symmetrically about the central axis of the memory cell. For example, as shown in FIG. 1, the arrangement sequence of the first select transistor T1, the first CMOS switch T3-T4, and the first MTJ element M1, which are disposed on the left side of the central axis, is symmetrical to the arrangement sequence of the second select transistor T2, the second CMOS switch T5-T6, and the second MTJ element M2, which are disposed on the right side.

The first and second MTJ elements M1 and M2 each include first and second magnetic layers, and a nonmagnetic layer (a tunnel barrier layer, for example) interposed between the first and second magnetic layers. Instead of a tunnel barrier layer, a nonmagnetic metal layer made of Cu or the like can be used as the nonmagnetic layer. One of the first and second magnetic layers has a changeable magnetization direction, and serves as the storage layer. The other one of the first and second magnetic layers has a fixed magnetization direction, and serves as the reference layer. Here, a "changeable" magnetization direction is a magnetization direction that can change before and after a write current is applied to the MTJ element. A "fixed" magnetization direction is a magnetization direction that does not change before and after a write current is applied to the MTJ element. Information "0" or information "1" is stored depending on whether the magnetization directions of the first and second magnetic layers are parallel to each other (a P state), or whether the magnetization directions are antiparallel to each other (an AP state). It should be noted that information "0" may be associated with an antiparallel state, and information "1" may be associated with a parallel state. The magnetization directions of the first and second magnetic layers may be parallel to the film plane, or may be perpendicular to the film plane. The "film plane" means the upper surface of a magnetic layer. In a case where the magnetization directions are perpendicular to the film plane, the first and second magnetic layers each have perpendicular magnetic anisotropy.

In a memory cell MC, the information to be stored into the first MTJ element M1 and the information to be stored into the second MTJ element M2 are complementary to each other. For example, the information to be stored into the first MTJ element M1 is "1", and the information to be stored into the second MTJ element M2 is "0". The first and second MTJ elements M1 and M2 are designed to have the same stacking sequence of the first magnetic layer, the tunnel barrier layer, and the second magnetic layer. This means that, if the first magnetic layer of the first MTJ element M1 is connected to the bit line BL in the circuit diagram shown in FIG. 1, for example, the first magnetic layer of the second MTJ element M2 is connected to the bit line /BL. In this embodiment, each of the magnetic layers of the first and second MTJ elements M1 and M2 connected to the bit lines BL and /BL is a reference layer.

(Read Operation)

Figure 2A:
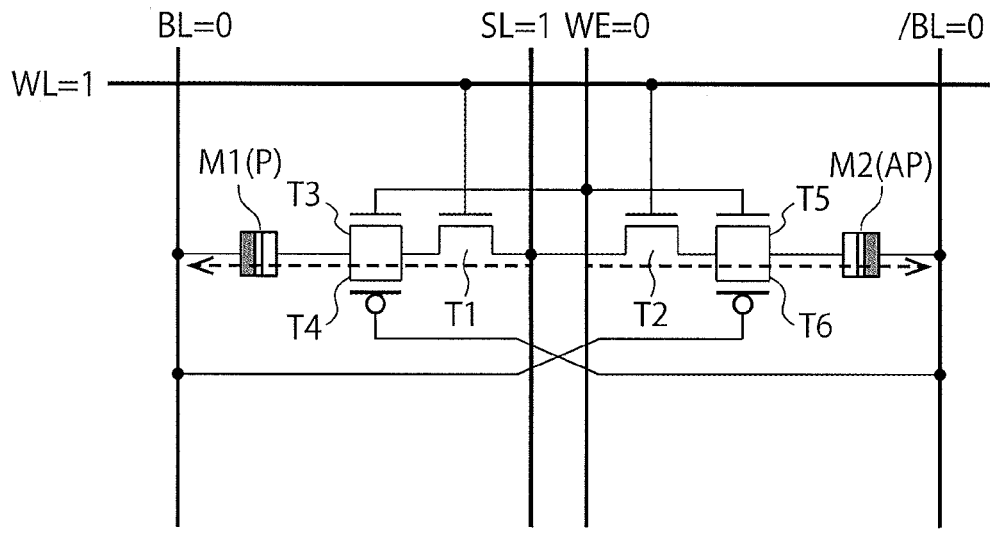
FIGS. 2A and 2B are diagrams for explaining a read operation of the nonvolatile memory according to the first embodiment.
Figure 2B:
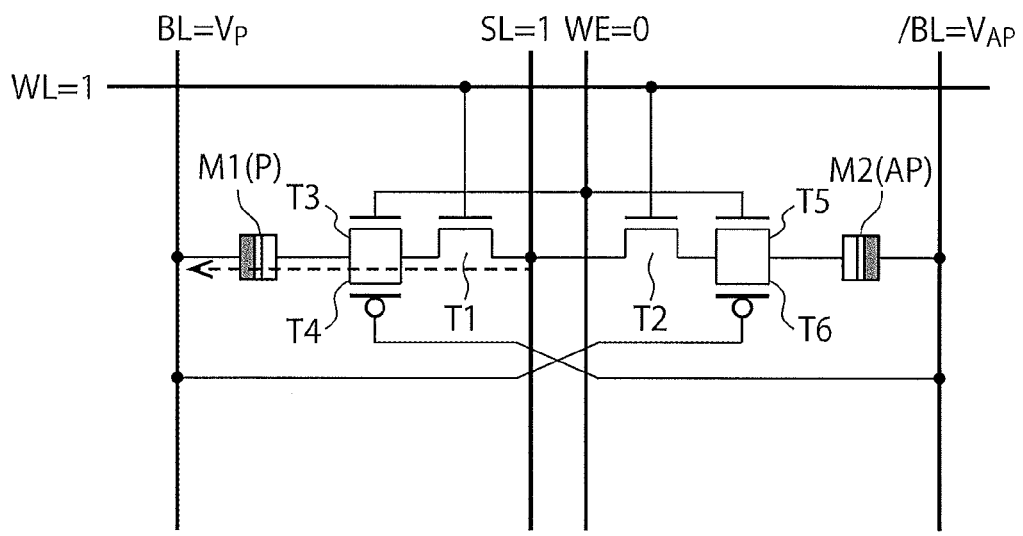

Referring now to FIGS. 2A and 2B, a read operation on a memory cell MC is described. As shown in FIG. 2A, in this example case, the magnetization directions of the storage layer and the reference layer of the first MTJ element M1 are in a parallel state, and the magnetization directions of the storage layer and the reference layer of the second MTJ element M2 are in an antiparallel state. First, pre-discharge is performed to set each of the bit lines BL and /BL at the "L" level ("0" level), and the potential of the write enable line WE is fixed at 0 V. The source line SL of the column to which the memory cell MC to be accessed belongs is set at the "H" level ("1" level). The word line WL of the row to which the memory cell MC to be accessed belongs is also set at the "1" level, so that the select transistors T1 and T2 are switched on, and a read current is applied from the source line SL to each of the bit lines BL and /BL (FIG. 2A). The dashed lines shown in FIG. 2A indicate the read current. Since the resistance values of the first and second MTJ elements M1 and M2 differ from each other at this point, the potential of the bit line BL connected to the first MTJ element M1 in a parallel state increases more quickly than the potential of the bit line /BL. As a result, the potential of the bit line BL exceeds the threshold voltage Vth of the p-channel transistors T4 and T6 before the potential of the bit line /BL connected to the second MTJ element M2 in an antiparallel state does. After the voltage $V_P$ of the bit line BL becomes higher than Vth ($V_P$>Vth), the p-channel MOS transistor T6 is switched off, and the current flowing into the second MTJ element M2 is shut off. At this point, the potential $V_{AP}$ of the bit line /BL is lower than Vth ($V_{AP}$<Vth), and the p-channel MOS transistor T4 remains in an on-state. The potential $V_P$ of the bit line BL is compared with the potential $V_{AP}$ of the bit line /BL, or the current flowing in the bit line BL is compared with the current flowing in the bit line /BL, to read information from the memory cell MC (FIG. 2B). At this point, the read current is flowing in the current direction to write a parallel state into the first and second MTJ elements M1 and M2. However, the current flowing into the second MTJ element M2 is shut off by the p-channel MOS transistor T6, and thus, a wrong write in the second MTJ element M2 is prevented. Meanwhile, the current flowing into the first MTJ element M1 flows in the direction to store information, and thus, any wrong write does not occur.

In the above described example case, the magnetization directions of the storage layer and the reference layer of the first MTJ element M1 are in a parallel state, and the magnetization directions of the storage layer and the reference layer of the second MTJ element M2 are in an antiparallel state. Also, each of the magnetic layers of the first and second MTJ elements M1 and M2 connected to the bit lines BL and /BL is a fixed layer. In this case, the current flowing into the MTJ element in an antiparallel state, or the second MTJ element, is shut off, and thus, a wrong write in the second MTJ element in an antiparallel state is prevented.

As opposed to the above described case where each of the magnetic layers of the first and second MTJ elements M1 and M2 connected to the bit lines BL and /BL is a reference layer, the magnetization directions of the storage layer and the reference layer of the first MTJ element M1 may be in an antiparallel state, and the magnetization directions of the storage layer and the reference layer of the second MTJ element M2 may be in a parallel state. In such a case, the read current is applied in the same manner as in the case described above with reference to FIG. 2A, and a read operation is performed. In this case, the current flowing into the MTJ element in an antiparallel state, or the current flowing into the first MTJ element, is shut off, and thus, a wrong write in the first MTJ element in an antiparallel state is also prevented.

As described above, the first CMOS switch and the second CMOS switch serve as current suppressing units, and the current suppressing units suppress the current in one of the MTJ elements as a pair, in accordance with the potentials of the pair of bit lines BL and /BL to which the memory cell including these current suppressing units is connected.

(Write Operation)

Figure 3:
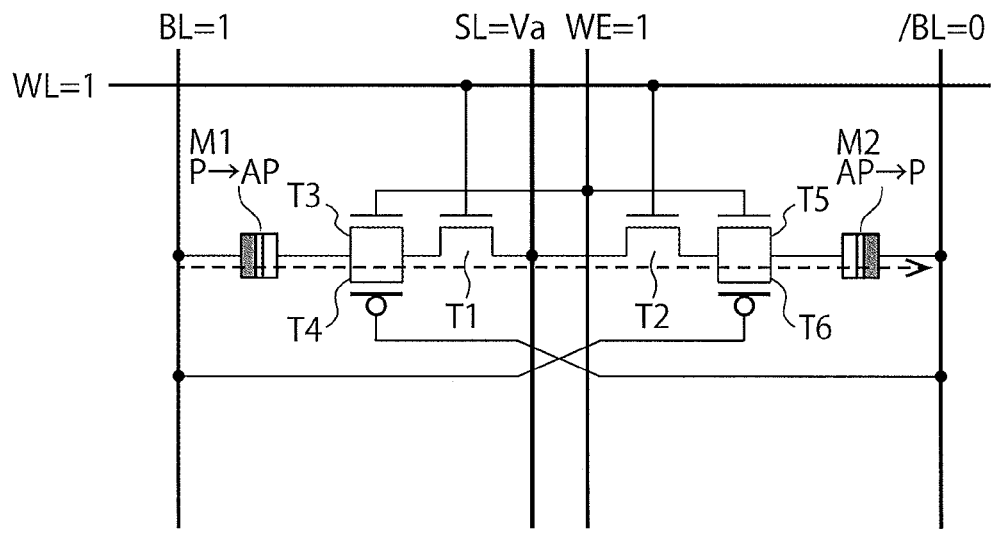
FIG. 3 is a diagram for explaining a write operation of the nonvolatile memory according to the first embodiment.

Referring now to FIG. 3, a write operation on a memory cell MC is described. As shown in FIG. 3, in this example case, the magnetization directions of the storage layer and the reference layer of the first MTJ element M1 are also in a parallel state, and the magnetization directions of the storage layer and the reference layer of the second MTJ element M2 are also in an antiparallel state.

First, the word line WL of the row to which the memory cell MC to be accessed belongs is set at the "1" level, and the write enable line WE is also set at the "1" level. The bit line BL is fixed at the "1" level, the bit line /BL is fixed at the "0" level, and the source line SL is fixed at a voltage Va between the "0" level and the "1" level. Where the logic "1" is Vdd, and the logic "0" is GND, the voltage Va is 0.5 Vdd, for example. The value of the voltage Va is preferably higher than 0.5 Vdd in practice, because the CMOS switch on the high-potential side of the source line SL switches on both the p-channel MOS transistor and the n-channel MOS transistor while only the n-channel MOS transistor is switched on on the low-potential side. At this point, a current in the direction of write of an antiparallel state flows into the first MTJ element M1, and a current in the direction of write of a parallel state flows into the second MTJ element M2. Consequently, the information in the memory cell MC is reversed (FIG. 3). If the voltages to be applied to the bit line BL and the bit line /BL are reversed, the first and second MTJ elements can switch magnetization configurations with each other.

The current suppressing units formed with the first CMOS switch and the second CMOS switch can switch operation between a read operation and a write operation, in accordance with the potential of the write enable line WE to which the memory cell including the current suppressing units is connected.

As described above, according to the first embodiment, a wrong write during a read operation can be prevented.

(First Modification)

Figure 4:
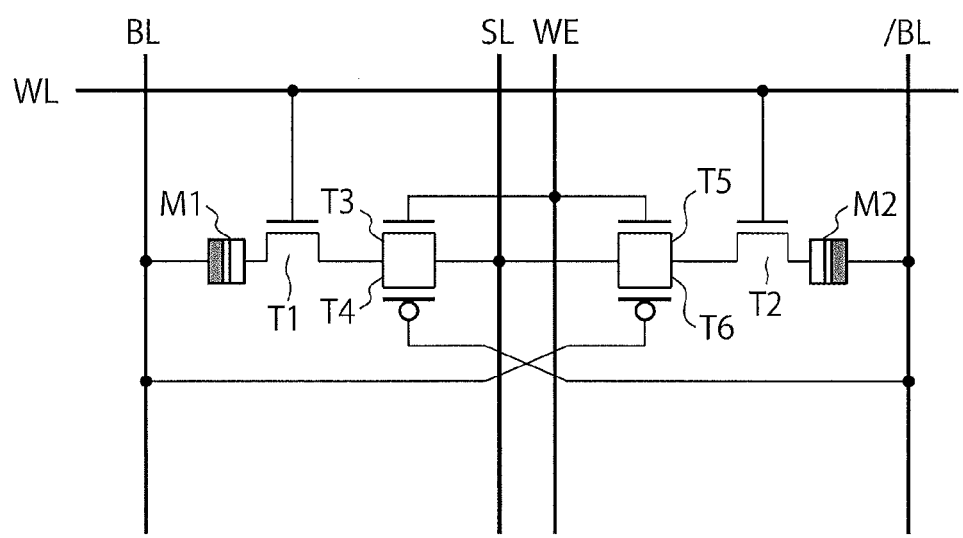
FIG. 4 is a circuit diagram showing a memory cell of a nonvolatile memory according to a first modification of the first embodiment.

Referring now to FIG. 4, a nonvolatile memory according to a first modification of the first embodiment is described. FIG. 4 is a circuit diagram showing a memory cell of the nonvolatile memory according to the first modification. A memory cell of this modification is the same as the memory cell of the first embodiment shown in FIG. 1, except that the first select transistor T1 switches positions with the first CMOS switch T3-T4, and the second select transistor T2 switches positions with the second CMOS switch T5-T6. Specifically, the first MTJ element M1, the first select transistor T1, and the first CMOS switch T3-T4 are connected in series in this order between the bit line BL and the source line SL, and the second MTJ element M2, the second select transistor T2, and the second CMOS switch T5-T6 are connected in series in this order between the bit line /BL and the source line SL. In the first modification, a read operation and a write operation can be performed, as in the first embodiment. Thus, like the first embodiment, the first modification can prevent a wrong write during a read operation.

(Second Modification)

Figure 5:
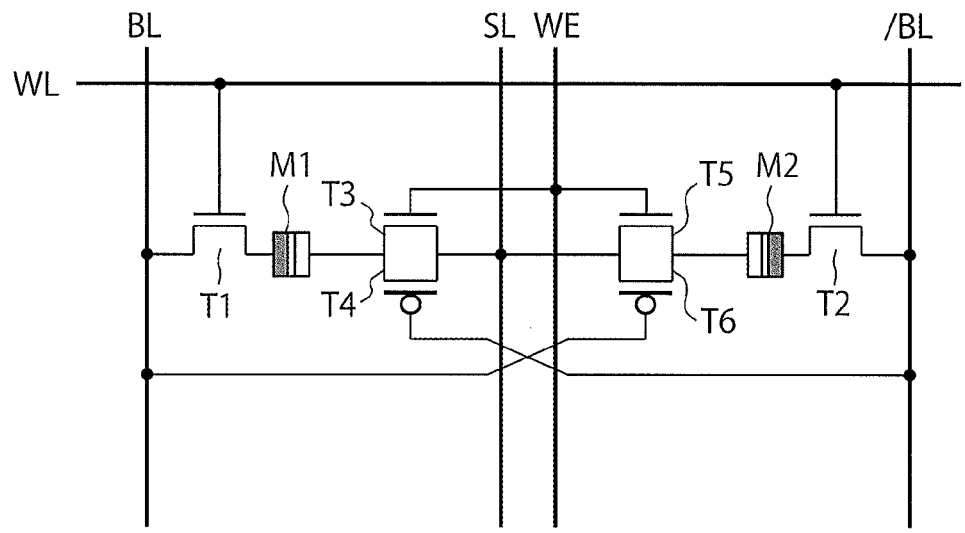
FIG. 5 is a circuit diagram showing a memory cell of a nonvolatile memory according to a second modification of the first embodiment.

Referring now to FIG. 5, a nonvolatile memory according to a second modification of the first embodiment is described. FIG. 5 is a circuit diagram showing a memory cell of the nonvolatile memory according to the second modification. A memory cell of this modification is the same as the memory cell of the first modification shown in FIG. 4, except that the arrangement sequence of the MTJ elements and the select transistors is reversed. Specifically, the first select transistor T1, the first MTJ element M1, and the first CMOS switch T3-T4 are connected in series in this order between the bit line BL and the source line SL, and the second select transistor T2, the second MTJ element M2, and the second CMOS switch T5-T6 are connected in series in this order between the bit line /BL and the source line SL. In the second modification, a read operation and a write operation can be performed, as in the first embodiment.

Thus, like the first embodiment, the second modification can prevent a wrong write during a read operation.

(Third Modification)

Figure 6:
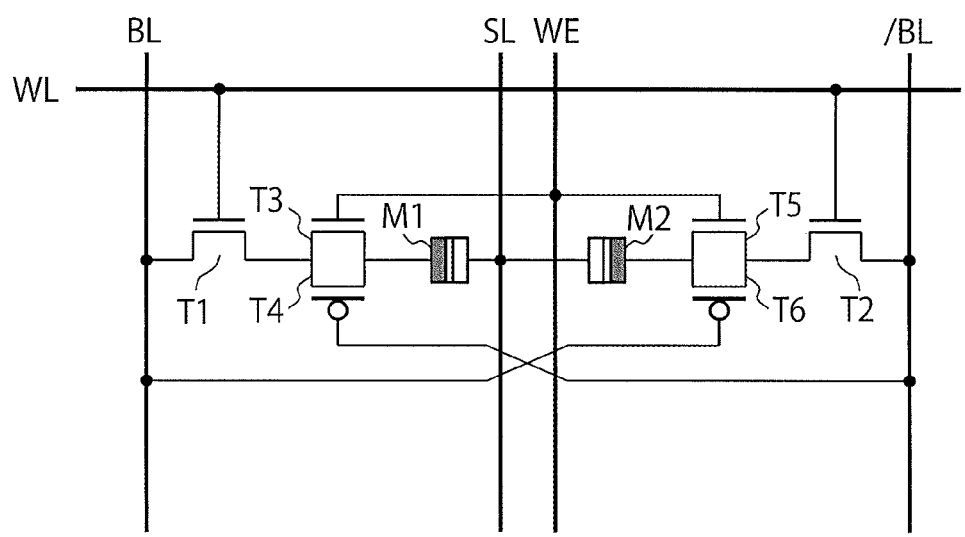
FIG. 6 is a circuit diagram showing a memory cell of a nonvolatile memory according to a third modification of the first embodiment.

Referring now to FIG. 6, a nonvolatile memory according to a third modification of the first embodiment is described.

FIG. 6 is a circuit diagram showing a memory cell of the nonvolatile memory according to the third modification. A memory cell of this modification is the same as the memory cell of the second modification shown in FIG. 5, except that the arrangement sequence of the MTJ elements and the CMOS switches is reversed. Specifically, the first select transistor T1, the first CMOS switch T3-T4, and the first MTJ element M1 are connected in series in this order between the bit line BL and the source line SL, and the second select transistor T2, the second CMOS switch T5-T6, and the second MTJ element M2 are connected in series in this order between the bit line /BL and the source line SL. In the third modification, a read operation and a write operation can be performed, as in the second modification. Thus, like the second modification, the third modification can prevent a wrong write during a read operation.

(Fourth Modification)

Figure 7:
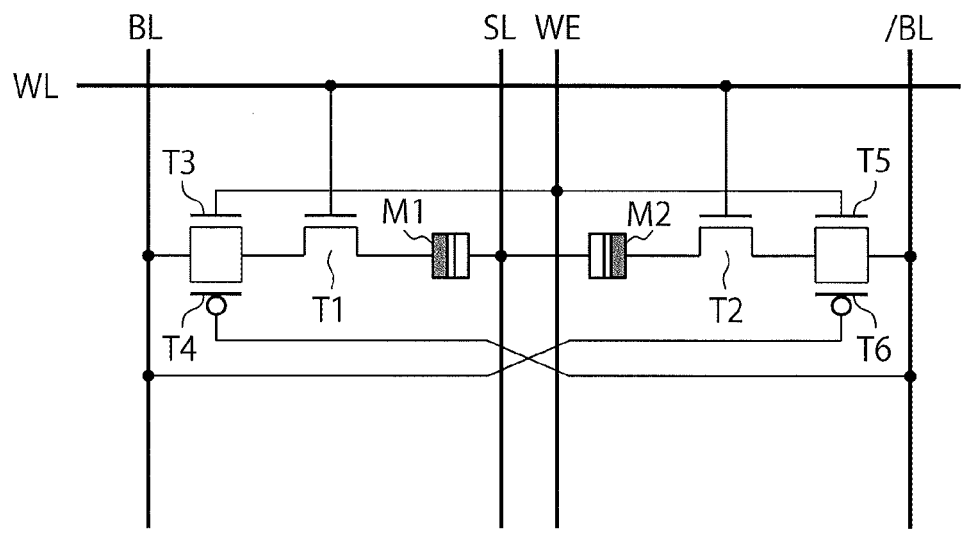
FIG. 7 is a circuit diagram showing a memory cell of a nonvolatile memory according to a fourth modification of the first embodiment.

Referring now to FIG. 7, a nonvolatile memory according to a fourth modification of the first embodiment is described. FIG. 7 is a circuit diagram showing a memory cell of the nonvolatile memory according to the fourth modification. A memory cell of this modification is the same as the memory cell of the third modification shown in FIG. 6, except that the arrangement sequence of the select transistors and the CMOS switches is reversed. Specifically, the first CMOS switch T3-T4, the first select transistor T1, and the first MTJ element M1 are connected in series in this order between the bit line BL and the source line SL, and the second CMOS switch T5-T6, the second select transistor T2, and the second MTJ element M2 are connected in series in this order between the bit line /BL and the source line SL. In the fourth modification, a read operation and a write operation can be performed, as in the third modification. Thus, like the third modification, the fourth modification can prevent a wrong write during a read operation.

(Fifth Modification)

Figure 8:
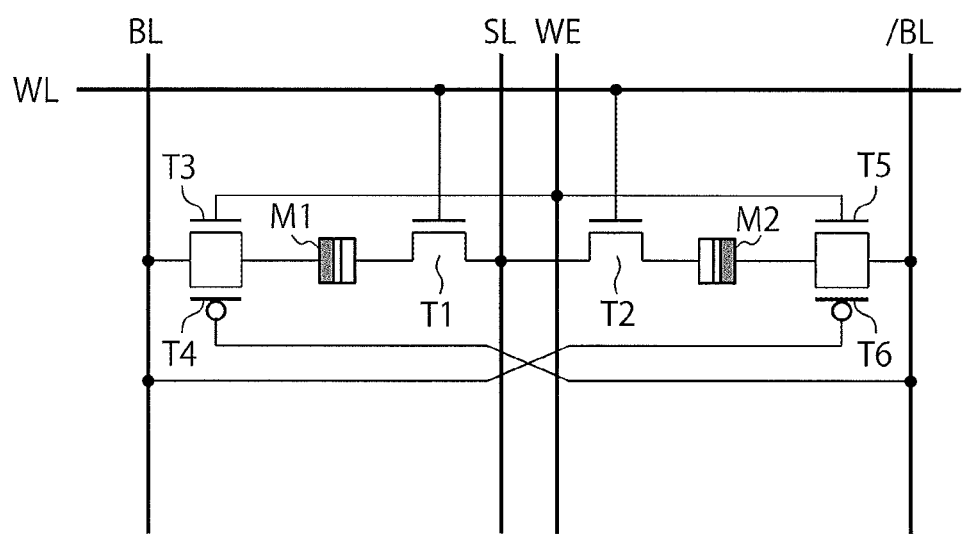
FIG. 8 is a circuit diagram showing a memory cell of a nonvolatile memory according to a fifth modification of the first embodiment.

Referring now to FIG. 8, a nonvolatile memory according to a fifth modification of the first embodiment is described. FIG. 8 is a circuit diagram showing a memory cell of the nonvolatile memory according to the fifth modification. A memory cell of this modification is the same as the memory cell of the fourth modification shown in FIG. 7, except that the arrangement sequence of the select transistors and the MTJ elements is reversed. Specifically, the first CMOS switch T3-T4, the first MTJ element M1, and the first select transistor T1 are connected in series in this order between the bit line BL and the source line SL, and the second CMOS switch T5-T6, the second MTJ element M2, and the second select transistor T2 are connected in series in this order between the bit line /BL and the source line SL. In the fifth modification, a read operation and a write operation can be performed, as in the fourth modification. Thus, like the fourth modification, the fifth modification can prevent a wrong write during a read operation.

(Sixth Modification)

Figure 9:
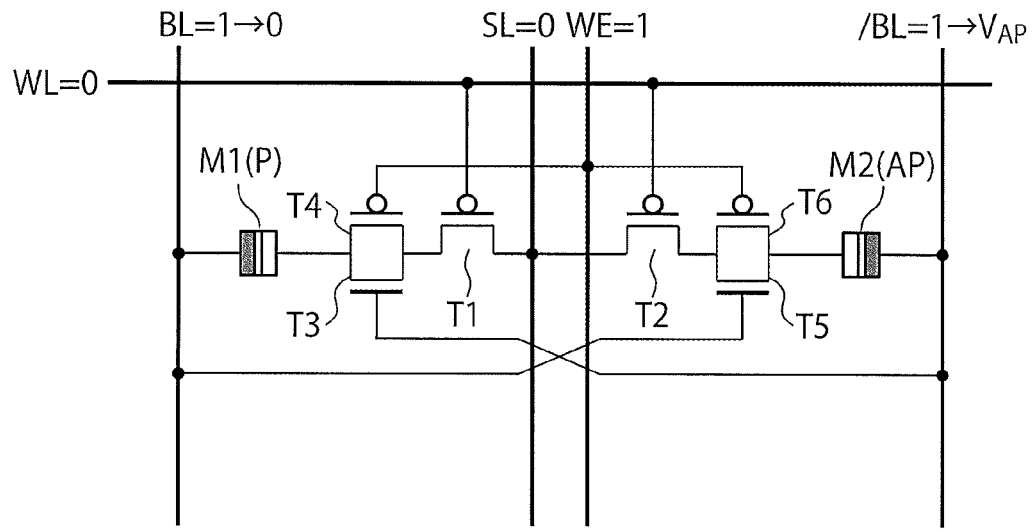
FIG. 9 is a circuit diagram showing a memory cell of a nonvolatile memory according to a sixth modification of the first embodiment.

Referring now to FIG. 9, a nonvolatile memory according to a sixth modification of the first embodiment is described. FIG. 9 is a circuit diagram for explaining a read operation of a memory cell of the nonvolatile memory according to the sixth modification. A memory cell of this modification is the same as the memory cell of the first embodiment shown in FIG. 1, except that the first and second select transistors T1 and T2 are changed from n-channel MOS transistors to p-channel MOS transistors, the gates of the p-channel MOS transistors T4 and T6 of the first and second CMOS switches are connected to the source line SL, the gate of the n-channel MOS transistor T3 is connected to the bit line /BL, and the gate of the n-channel MOS transistor T5 is connected to the bit line BL.

As shown in FIG. 9, in a read operation according to the sixth modification, the levels of the potentials of the word line WL, the bit lines BL and /BL, the source line SL, and the write enable line WE are the opposite of the potential levels in the read operation according to the first embodiment shown in FIG. 2A. Specifically, a potential at the "0" level is applied to the word line WL and the source line SL, and a potential at the "1" level is applied to the bit lines BL and /BL and the write enable line WE.

In the sixth modification, the current flowing in the first and second MTJ elements M1 and M2 is a current in the opposite direction from that in the case of the first embodiment. Therefore, the stacking sequence in the first and second MTJ elements is the opposite of that in the case of the first embodiment. That is, each of the magnetic layers of the first and second MTJ elements M1 and M2 connected to the bit lines BL and /BL is a storage layer.

In the sixth modification, the wiring lines that need pre-charging for a read operation are the two wiring lines BL and /BL. In the first embodiment, on the other hand, only the source line SL is the wiring line that needs pre-charging for a read operation. In view of this, the first embodiment is preferable to the sixth modification. In the sixth modification, a read operation and a write operation can be performed, as in the first embodiment. Thus, like the first embodiment, the sixth modification can prevent a wrong write during a read operation.

In the sixth modification, the arrangement sequence of the first MTJ element M1, the first CMOS switch T3-T4, and the first select transistor T1 may be changed, and the arrangement sequence of the second MTJ element M2, the second CMOS switch T5-T6, and the second select transistor T2 may be changed, as in the first through fifth modifications.

The first switch T3-T4 and the second switch T5-T6 can be formed of p-channel transistors or can be formed of n-channel transistors by combining the sixth modification with the first embodiment. For example, if the first switch T3-T4 and the second switch T5-T6 are n-channel transistors, the source line SL and the write enable line are "0", the bit lines BL and /BL and the word line WL are "1" in the read operation.

(Seventh Modification)

Figure 10:
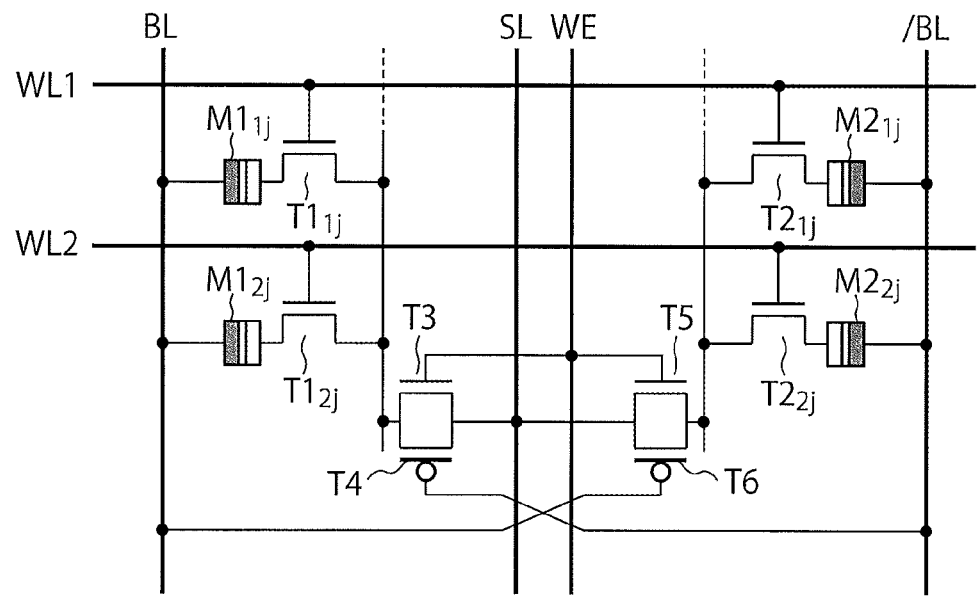
FIG. 10 is a circuit diagram showing a memory cell of a nonvolatile memory according to a seventh modification of the first embodiment.

Referring now to FIG. 10, a nonvolatile memory according to a seventh modification of the first embodiment is described. FIG. 10 is a circuit diagram showing a nonvolatile memory according to the seventh modification. The nonvolatile memory according to the seventh modification differs from the nonvolatile memory of the first embodiment, except that the first and second CMOS switches of a memory cell are shared among memory cells. In FIG. 10, the first and second CMOS switches are shared among the N (N≥2) memory cells in the same column. For example, as shown in FIG. 10, the first CMOS switch T3-T4 is connected to the first select transistor $T1_{1j}$ of the memory cell in the first row and the jth (j=1, . . . ) column, and is also connected to the first select transistor $T1_{2j}$ of the memory cell in the second row and the jth (j=1, . . . ) column. In this manner, the first CMOS switch T3-T4 is shared. Meanwhile, the second CMOS switch T5-T6 is connected to the second select transistor $T2_{1j}$ of the memory cell in the first row and the jth (j=1, . . . ) column, and is also connected to the second select transistor $T2_{2j}$ of the memory cell in the second row and the jth (j=1, . . . ) column. In this manner, the second CMOS switch T5-T6 is shared.

As the first and second CMOS switches that constitute a wrong write preventing circuit are shared among the N memory cells as described above, the overhead of the occupied area can be reduced to 1/N.

Also, in the seventh modification, a read operation and a write operation can be performed, as in the first embodiment. Thus, like the first embodiment, the seventh modification can prevent a wrong write during a read operation.

(Eighth Modification)

Figure 11:
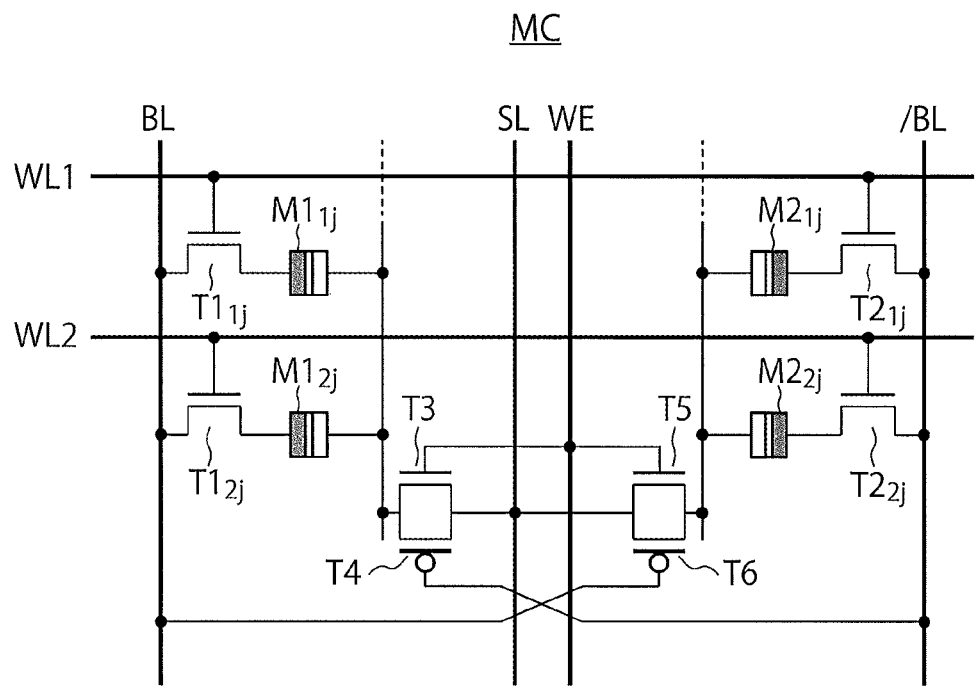
FIG. 11 is a circuit diagram showing a memory cell of a nonvolatile memory according to an eighth modification of the first embodiment.

In the seventh modification, the arrangement sequence of the select transistors and the MTJ elements may be reversed as shown in an eighth modification in FIG. 11. As shown in FIG. 11, the first CMOS switch T3-T4 is connected to the first select transistor $T1_{1j}$ or the first MTJ element $M1_{1j}$ of the memory cell in the first row and the jth (j=1, . . . ) column, and is also connected to the first select transistor $T1_{2j}$ or the first MTJ element $M1_{2j}$ of the memory cell in the second row and the jth (j=1, . . . ) column. In this manner, the first CMOS switch T3-T4 is shared. Meanwhile, the second CMOS switch T5-T6 is connected to the second select transistor $T2_{1j}$ or the second MTJ element $M2_{1j}$ of the memory cell in the first row and the jth (j=1, . . . ) column, and is also connected to the second select transistor $T2_{2j}$ or the second MTJ element $M2_{2j}$ of the memory cell in the second row and the jth (j=1, . . . ) column. In this manner, the second CMOS switch T5-T6 is shared.

Like the seventh modification, the eighth modification can reduce the overhead of the occupied area to 1/N, and prevent a wrong write during a read operation.

In the seventh or eighth modification, the logics during operation may be reversed, and the stacking sequence in the first and second MTJ elements may be changed, as in the sixth modification. In this case, the connections of the n-channel MOS transistors and the p-channel MOS transistors forming the first and second CMOS switches are switched.

In the first through eighth modifications, the first CMOS switch and the second CMOS switch serve as current suppressing units, and the current suppressing units suppress the current in one of the MTJ elements as a pair, in accordance with the potentials of the pair of bit lines BL and /BL to which the memory cell including the current suppressing units is connected, as in the first embodiment. Furthermore, the current suppressing units can switch operation between a read operation and a write operation, in accordance with the potential of the write enable line WE to which the memory cell including the current suppressing units is connected.

In a case where a current suppressing unit is formed with a switch as described above, an MTJ element, the current suppressing unit, and a select transistor are connected in series, and the arrangement sequence of these components can be changed freely. Thus, circuits can be designed without restriction.

Figure 12:
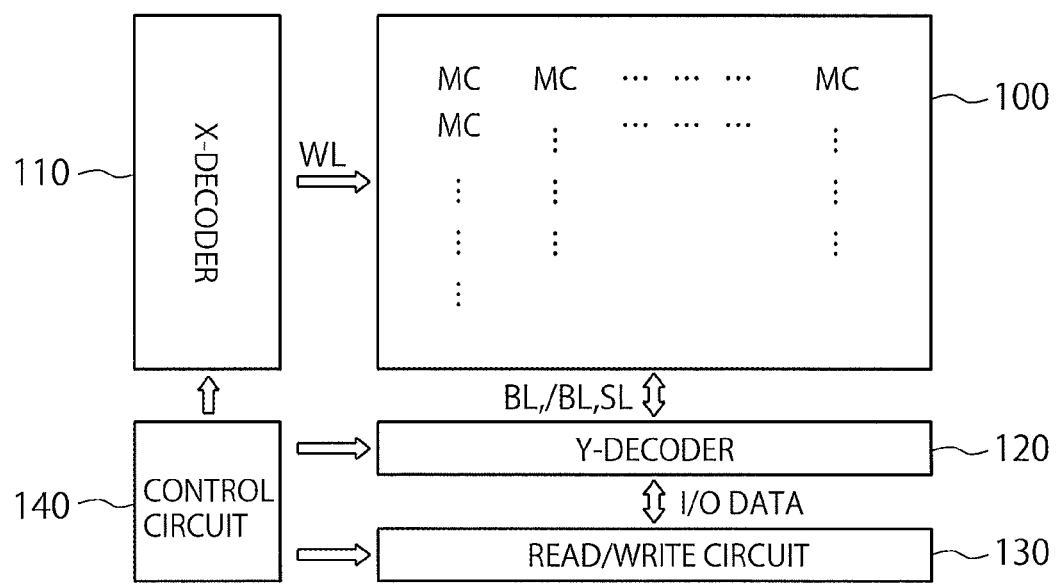
FIG. 12 is a block diagram showing the configuration of a nonvolatile memory according to each embodiment.

In the first embodiment and the first through eighth modifications described above, a read operation and a write operation are performed with the use of a read/write circuit, as shown in FIG. 12. FIG. 12 is a block diagram showing a nonvolatile memory according to the first embodiment or one of the first through eighth modifications. This nonvolatile memory includes a cell array 100 in which memory cells MC are arranged in a matrix fashion, an X-decoder 110, a Y-decoder 120, a read/write circuit 130, and a control circuit 140.

In a read operation in this nonvolatile memory, a command signal is first sent from the control circuit 140 to the X-decoder 110 and the Y-decoder 120, a word line WL is selected by the X-decoder 110, bit lines BL and /BL and a source line SL are selected by the Y-decoder 120, and the potentials of the selected lines are controlled (refer to the read operation according to the first embodiment). In this manner, information is read from the selected memory cell MC. This read information is output to the outside via the read/write circuit 130.

In a write operation, a command signal is sent from the control circuit 140 to the X-decoder 110 and the Y-decoder 120, a word line WL is selected by the X-decoder 110, bit lines BL and /BL and a source line SL are selected by the Y-decoder 120, and the potentials of the selected lines are controlled (refer to the write operation according to the first embodiment), as in the read operation. In this manner, information is written into the selected memory cell MC.

It should be noted that the nonvolatile memory shown in FIG. 12 may also be used in write operations and read operations of the nonvolatile memories according to the second through fourth embodiments described later.

Second Embodiment

Figure 13:
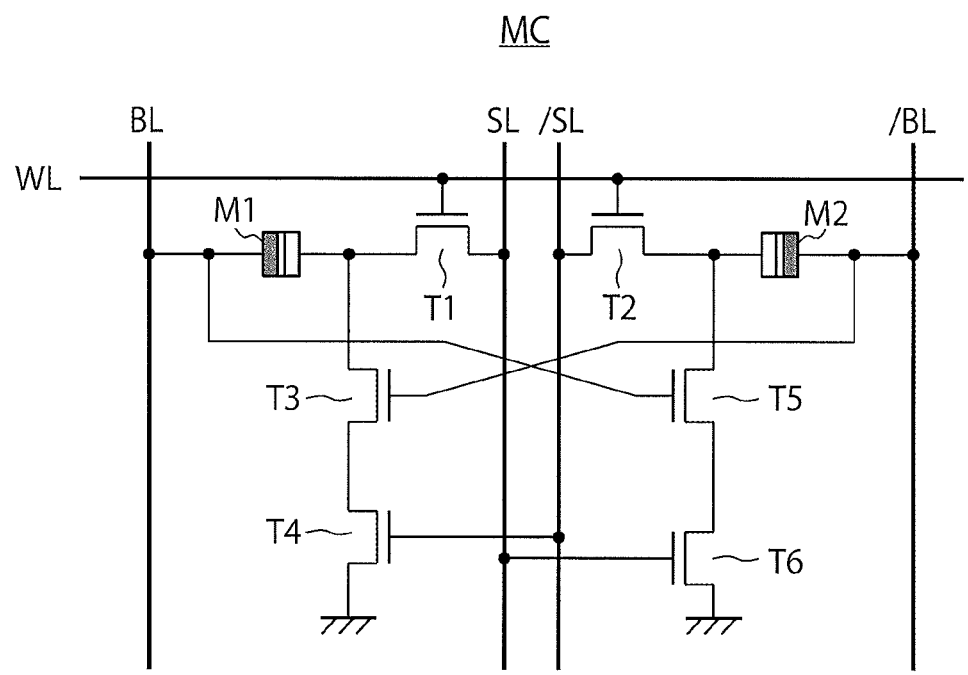
FIG. 13 is a circuit diagram showing a memory cell of a nonvolatile memory according to a second embodiment.

Referring now to FIG. 13, a nonvolatile memory according to a second embodiment is described. The nonvolatile memory of the second embodiment includes memory cells arranged in a matrix fashion, and each of the memory cells has the structure shown in FIG. 13. A memory cell MC includes first and second MTJ elements M1 and M2, first and second select transistors T1 and T2 formed with n-channel MOS transistors, and a wrong write preventing circuit. The wrong write preventing circuit includes n-channel MOS transistors T3, T4, T5, and T6.

In the nonvolatile memory of this embodiment, a pair of bit lines BL and /BL, and a pair of source lines SL and /SL are provided for each column of the memory cells. A word line WL is provided for each row of the memory cells.

The first MTJ element M1 and the first select transistor T1 are connected in series between the bit line BL and the source line SL provided for the column to which the memory cell MC belongs. Specifically, in FIG. 13, the reference layer of the first MTJ element M1 is connected to the bit line BL, the storage layer of the first MTJ element M1 is connected to one of the source and the drain of the first select transistor T1, and the other one of the source and the drain of the first select transistor T1 is connected to the source line SL. Meanwhile, the reference layer of the second MTJ element M2 is connected to the bit line /BL, the storage layer of the second MTJ element M2 is connected to one of the source and the drain of the second select transistor T2, and the other one of the source and the drain of the second select transistor T2 is connected to the source line /SL. The second MTJ element M2 and the second select transistor T2 are connected in series between the bit line /BL and the source line /SL provided for the column to which the memory cell MC belongs. The respective gates of the first and second select transistors T1 and T2 are connected to the word line WL.

The n-channel MOS transistors T3 and T4 are connected in series, and form a path for current suppression. Specifically, the drain of the n-channel MOS transistor T3 is connected to a common connection node between the first MTJ element M1 and the first select transistor T1, and the source of the n-channel MOS transistor T4 is grounded. The gate of the n-channel MOS transistor T3 is connected to the bit line /BL, and the gate of the n-channel MOS transistor T4 is connected to the source line /SL.

The n-channel MOS transistors T5 and T6 are connected in series, and form a current suppressing path. Specifically, the drain of the n-channel MOS transistor T5 is connected to a common connection node between the second MTJ element M2 and the second select transistor T2, and the source of the n-channel MOS transistor T6 is grounded. The gate of the n-channel MOS transistor T5 is connected to the bit line BL, and the gate of the n-channel MOS transistor T6 is connected to the source line SL.

In each of the memory cells MC of the second embodiment and the modifications described later, the components of the memory cell are arranged symmetrically about the central axis of the memory cell, as in the first embodiment.

In each memory cell MC of the second embodiment, the information to be stored into the first MTJ element M1 and the information to be stored into the second MTJ element M2 are complementary to each other, as in the first embodiment.

In the second embodiment, the transistors in the memory cells MC are n-channel MOS transistors. Accordingly, the manufacturing process becomes simpler, and any power-supply wiring lines are not required. Thus, leakage in the cells during each standby time can be reduced or prevented, and the area of the entire memory can be made smaller.

Figure 14:
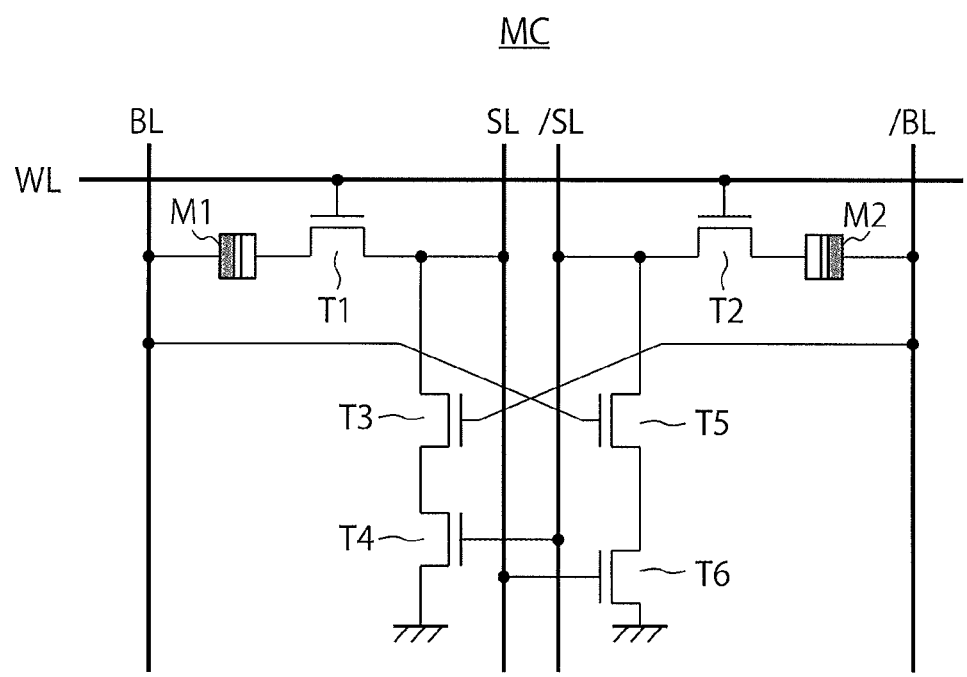
FIG. 14 is a circuit diagram showing a memory cell of a nonvolatile memory according to a first modification of the second embodiment.

As in a first modification of the second embodiment shown in FIG. 14, the drain of the n-channel MOS transistor T3 may be connected to a common connection node between the first select transistor T1 and the source line SL, and the drain of the n-channel MOS transistor T5 may be connected to a common connection node between the second select transistor T2 and the source line /SL.

(Read Operation)

Figure 15A:
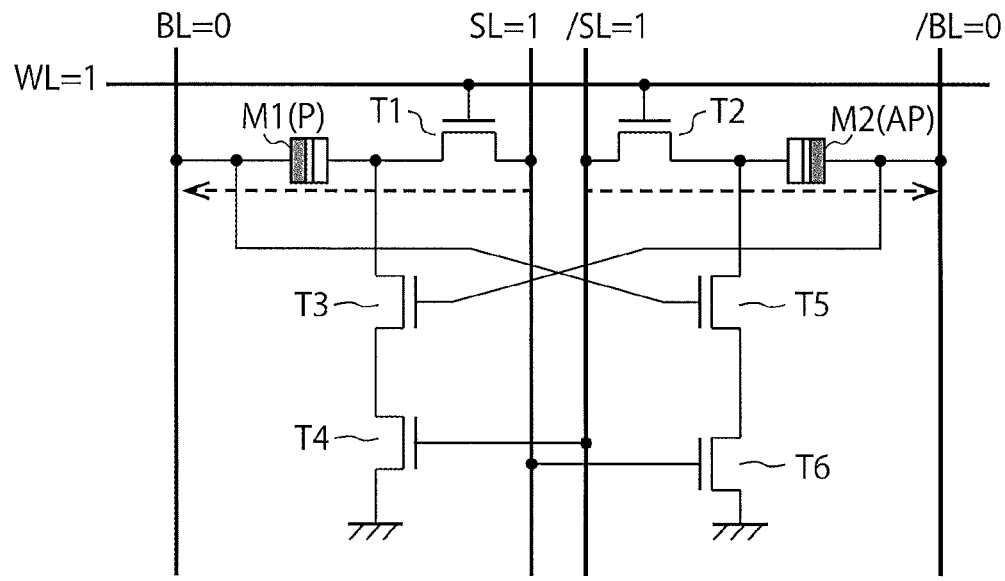
FIGS. 15A and 15B are diagrams for explaining a read operation of the nonvolatile memory according to the second embodiment.
Figure 15B:
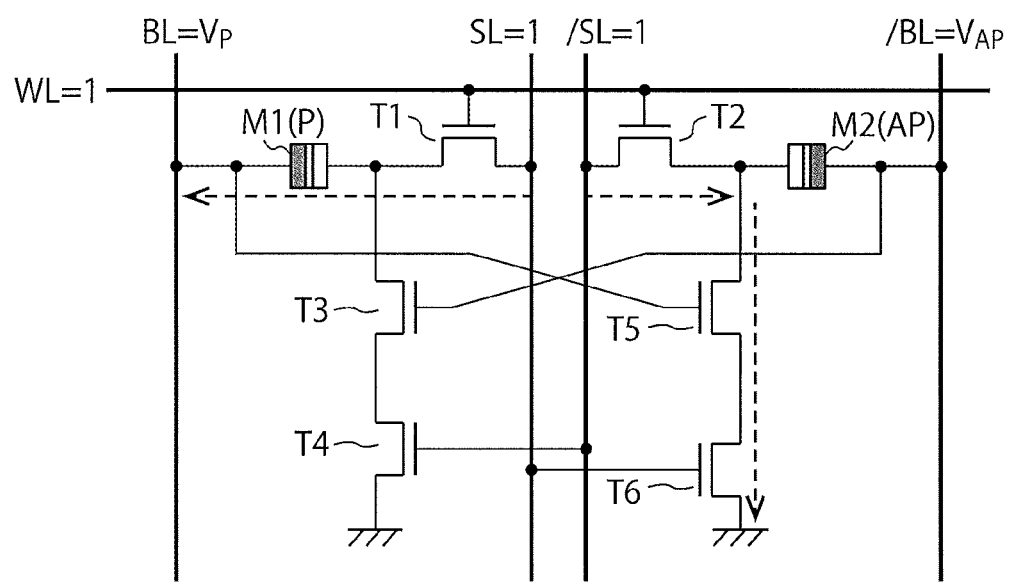

Referring now to FIGS. 15A and 15B, a read operation of the nonvolatile memory according to the second embodiment is described. In this read operation, pre-discharge is first performed on the bit lines BL and /BL as in the first embodiment, and the potentials of the word line WL and the source lines SL and /SL are set at the "1" level (FIG. 15A). As a result, a read current in the direction from the source line SL toward the bit line BL flows into the first MTJ element M1, and a read current in the direction from the source line /SL toward the bit line /BL flows into the second MTJ element M2. In FIGS. 15A and 15B, the arrows accompanied by dashed lines indicate the current directions. If the magnetization configuration in the first MTJ element M1 is in a parallel state (P), and the magnetization configuration in the second MTJ element M2 is in an antiparallel state (AP), the potential of the bit line BL exceeds the threshold voltage Vth of the n-channel MOS transistors T5 and T3 before the potential of the bit line /BL does. Therefore, the n-channel MOS transistor T5 is switched on before the n-channel MOS transistor T3 is switched on. As the n-channel MOS transistor T5 is switched on, the current suppressing path that extends from the source line /SL to GND and are formed with the MOS transistors T5 and T6 is switched on in the right-side portion of the symmetrical structure of the memory cell (FIG. 15B). As a result, the current that is flowing in the wrong-write direction toward the second MTJ element M2 is suppressed, and flows into the path to GND, instead. At this point, the voltage $V_{AP}$ of the bit line /BL is lower than the threshold voltage Vth, and therefore, the n-channel MOS transistor T3 remains in an off-state. Accordingly, it is possible to read the information "0" or "1" stored in the memory cell MC by referring to the voltages ($V_P$ and $V_{AP}$) of the bit line BL and the bit line /BL, or the currents in the bit line BL and the bit line /BL.

As described above, in the second embodiment and the first modification thereof, the first current suppressing path formed with the n-channel MOS transistors T3 and T4 connected in series, and the second current suppressing path formed with the n-channel MOS transistors T5 and T6 serve as current suppressing units, and the current suppressing units suppress the current in one of the MTJ elements as a pair, in accordance with the potentials of the pair of bit lines BL and /BL to which the memory cell including the current suppressing units is connected.

In the first modification of the second embodiment, information can be read from a memory cell MC, as in the second embodiment.

(Write Operation)

Figure 16:
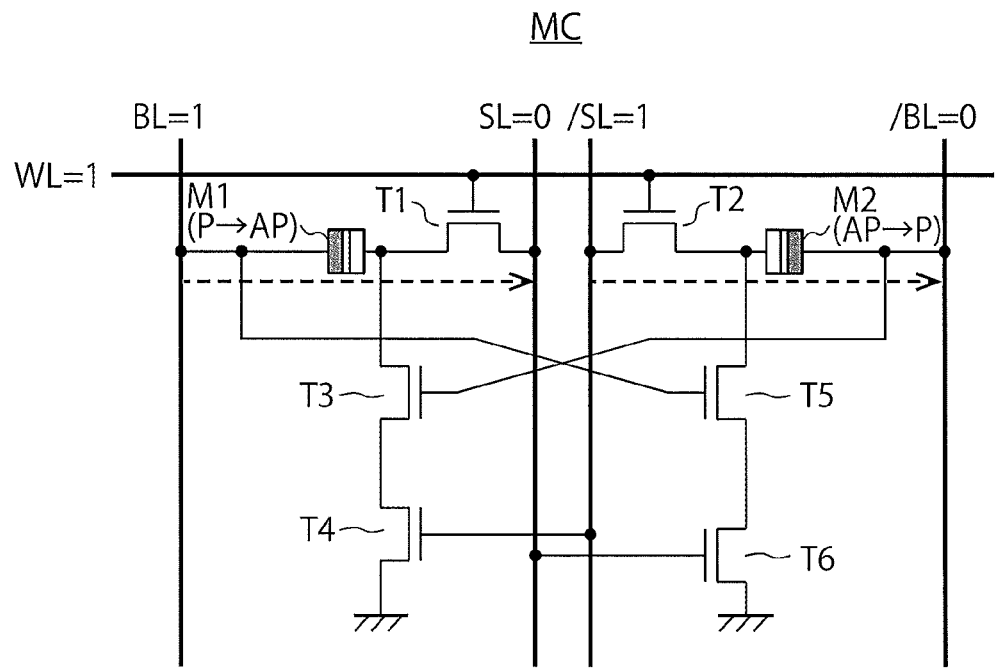
FIG. 16 is a diagram for explaining a write operation of the nonvolatile memory according to the second embodiment.

Referring now to FIG. 16, a write operation of the nonvolatile memory according to the second embodiment is described. First, as shown in FIG. 16, the potentials of the bit line BL and the source line /SL are set at the "1" level, the potentials of the source line SL and the bit line /BL are fixed at the "0" level, the potential of the word line WL is set at the "1" level, and the first and second select transistors T1 and T2 are switched on. As a result, current flows in the direction to write an antiparallel state in the first MTJ element M1, and current flows in the direction to write a parallel state in the second MTJ element M2. Consequently, the information in the memory cell MC is rewritten. At this point, the current suppressing path formed with the n-channel MOS transistor T3 and the n-channel MOS transistor T4, and the current suppressing path formed with the n-channel MOS transistor T5 and the n-channel MOS transistor T6 do not open, since one of the transistors is always in an off-state in each of the current suppressing paths.

It is also possible to write the opposite information into the memory cell MC by reversing the voltages of the bit line BL, the source line SL, the bit line /BL, and the source line /SL. Specifically, it is possible to write information so that the magnetization configuration in the first MTJ element M1 becomes parallel, and the magnetization configuration in the second MTJ element M2 becomes antiparallel.

Furthermore, the current suppressing units can switch operation between a read operation and a write operation, in accordance with the potentials of the pair of source lines SL and /SL to which the memory cell including the current suppressing units is connected.

As described above, according to the second embodiment and the first modification thereof, a wrong write during a read operation can be prevented.

(Second Modification)

Figure 17:
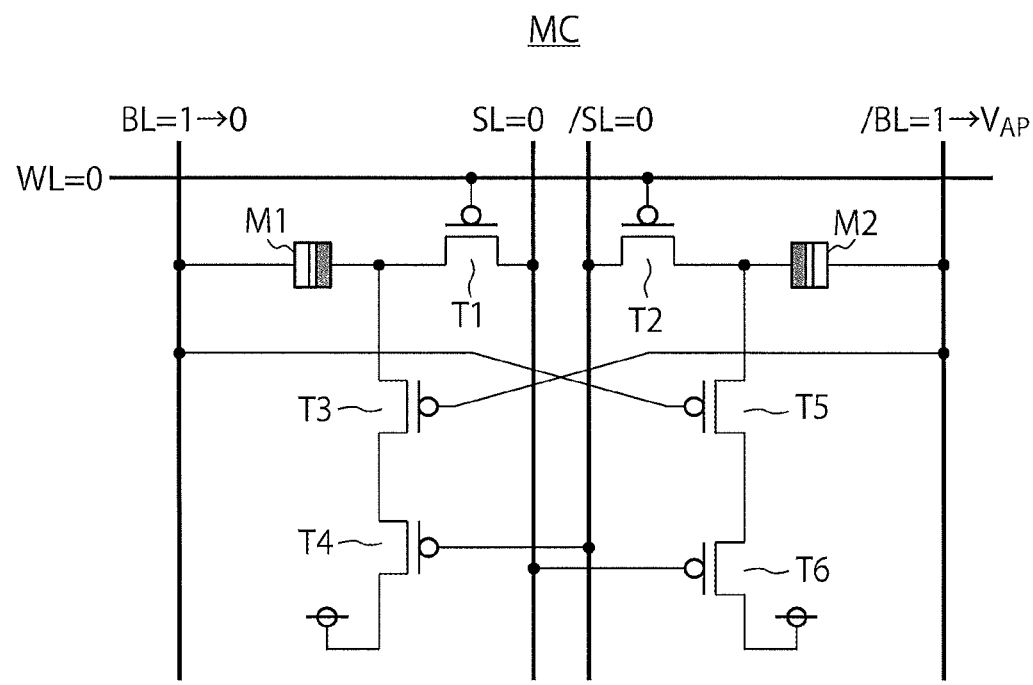
FIG. 17 is a diagram for explaining a read operation of the nonvolatile memory according to a second modification of the second embodiment.

Referring now to FIG. 17, a nonvolatile memory according to a second modification of the second embodiment is described. FIG. 17 is a circuit diagram showing a memory cell of the nonvolatile memory according to the second modification. A memory cell according to the second modification is the same as a memory cell according to the second embodiment, except that the first and second select transistors T1 and T2 formed with n-channel MOS transistors are replaced with p-channel MOS transistors, the n-channel MOS transistors T3, T4, T5, and T6 are replaced with p-channel MOS transistors, the magnetic layer of the first MTJ element M1 connected to the bit line BL is the storage layer of the first MTJ element M1, and the magnetic layer of the second MTJ element M2 connected to the bit line /BL is the storage layer of the second MTJ element M2. In the second modification, the logics of the voltages in a circuit operation are the opposite of those of the second embodiment, and the current suppressing circuit opens a path to a power supply voltage, instead of the ground.

The principles of operation according to the second modification are as follows. The source line SL is fixed at the "0" level, and the bit line BL is pre-charged. The word line WL is then set at the "0" level, so that the transistors T1 and T2 are switched on, and the voltage of the bit line BL starts dropping. As a result, the transistors T3 and T5 are switched on, and the current from the power source is supplied to the source line SL.

At this point, the voltage $V_{AP}$ should be lower than the power supply voltage, and be higher than the operating voltage of the p-channel MOS transistors. The current flowing into the first and second MTJ elements M1 and M2 is switched to the direction to write an antiparallel state in accordance with a difference between Vdd and $V_{AP}$, though this switching depends on the parasitic resistance of the p-channel MOS transistors. Consequently, it might be possible to assist the reading of information "0" or "1".

In the second modification, a first current path circuit formed with the p-channel MOS transistors T3 and T4 connected in series, and a second current path circuit formed with the p-channel MOS transistors T5 and T6 serve as current suppressing units, and the current suppressing units suppress the current in one of the MTJ elements as a pair, in accordance with the potentials of the pair of bit lines BL and /BL to which the memory cell including the current suppressing units is connected, as in the second embodiment.

Furthermore, the current suppressing units can switch operation between a read operation and a write operation, in accordance with the potentials of the pair of source lines SL and /SL to which the memory cell including the current suppressing units is connected.

In a case where p-channel MOS transistors are used as in the second modification, p-channel MOS transistors such as strained transistors that are more sophisticated than n-channel MOS transistors are used so that the area of the entire memory can be reduced, and higher performance can be achieved.

In the second embodiment and the first and second modifications, the MOS transistor T3 may switch positions with the MOS transistor T4, and the MOS transistor T5 may switch positions with the MOS transistor T6. Specifically, the MOS transistors T3 and T5 may be disposed on the GND side, and the MOS transistors T4 and T6 may be disposed on the first MTJ element side and the second MTJ element side, respectively.

Like the second embodiment, the second modification can prevent a wrong write during a read operation.

(Third Modification)

Figure 18:
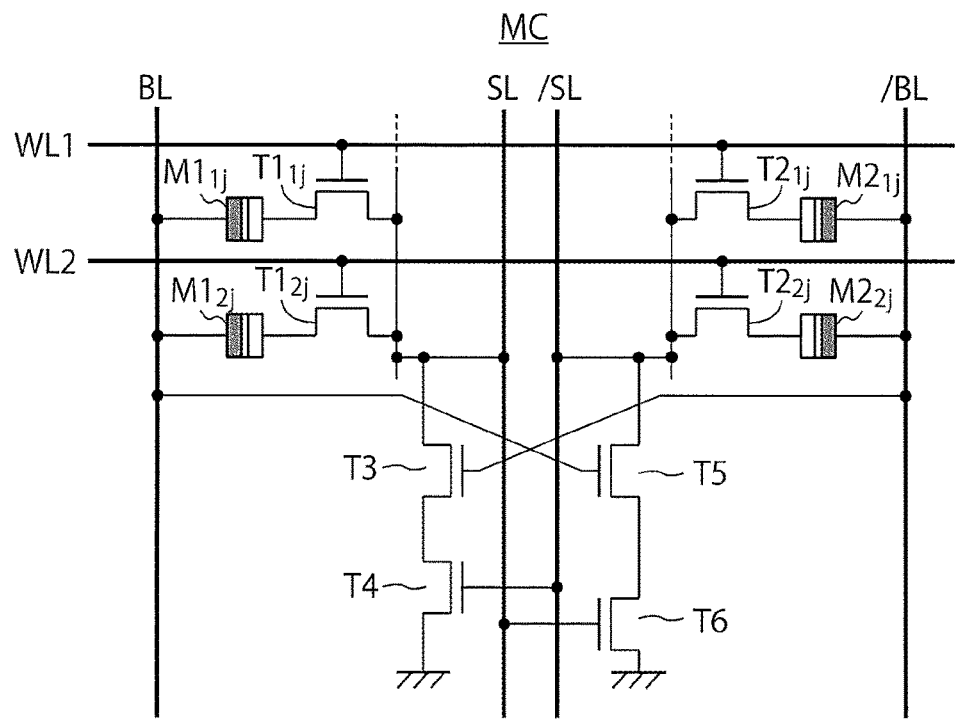
FIG. 18 is a diagram for explaining a write operation of the nonvolatile memory according to a third modification of the second embodiment.

Referring now to FIG. 18, a nonvolatile memory according to a third modification of the second embodiment is described. FIG. 18 is a circuit diagram showing a memory cell of the nonvolatile memory according to the third modification. A memory cell according to the third embodiment is the same as each memory cell in the nonvolatile memory of the second embodiment, except for sharing current suppressing paths with other memory cells. For example, as shown in FIG. 18, the current suppressing path T3-T4 is connected to the first select transistor $T1_{1j}$ of the memory cell in the first row and the jth (j=1, . . . ) column, and is also connected to the first select transistor $T1_{2j}$ of the memory cell in the second row and the jth (j=1, . . . ) column. In this manner, the current suppressing path T3-T4 is shared. Meanwhile, the current suppressing path T5-T6 is connected to the second select transistor $T2_{1j}$ of the memory cell in the first row and the jth (j=1, . . . ) column, and is also connected to the second select transistor $T2_{2j}$ of the memory cell in the second row and the jth (j=1, . . . ) column. In this manner, the current suppressing path T5-T6 is shared.

As the current suppressing units formed with two current paths are shared among the N memory cells as described above, the overhead of the occupied area can be reduced to 1/N.

In the third modification, a first current suppressing path formed with the n-channel MOS transistors T3 and T4 connected in series, and a second current suppressing path formed with the n-channel MOS transistors T5 and T6 serve as current suppressing units, and the current suppressing units suppress the current in one of the MTJ elements as a pair, in accordance with the potentials of the pair of bit lines BL and /BL to which the memory cell including the current suppressing units is connected, as in the second embodiment.

Furthermore, the current suppressing units can switch operation between a read operation and a write operation, in accordance with the potentials of the pair of source lines SL and /SL to which the memory cell including the current suppressing units is connected.

Like the second embodiment, the third modification can prevent a wrong write during a read operation.

In the second embodiment and the first through third modifications, the current suppressing units formed with the first and second current suppressing paths are connected in parallel to the current paths for write operations. Since the paths are closed during a write operation, no resistance increase occurs during the write operation, and it is easy to secure the write current.

Third Embodiment

Figure 19:
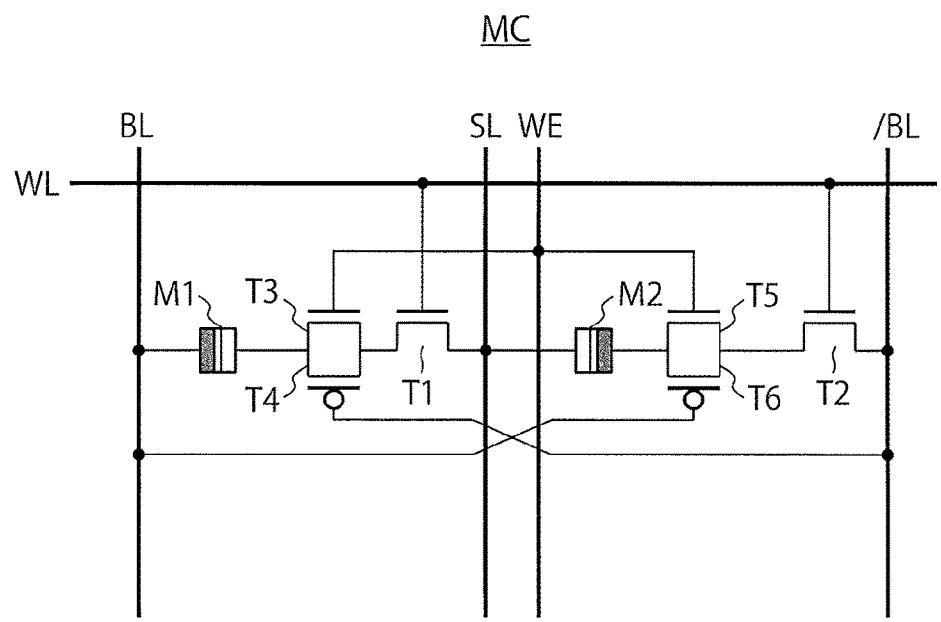
FIG. 19 is a circuit diagram showing a memory cell of a nonvolatile memory according to a third embodiment.

Referring now to FIG. 19, a nonvolatile memory according to a third embodiment is described. The nonvolatile memory of the third embodiment includes memory cells arranged in a matrix fashion, and each of the memory cells has the structure shown in FIG. 19. As shown in FIG. 19, a memory cell MC according to the third embodiment differs from the memory cell MC of the first embodiment shown in FIG. 1 in that the arrangement of the components is asymmetrical about the central axis. Specifically, while the first select transistor T1, the first CMOS switch T3-T4, and the first MTJ element M1 are arranged in this order on the left side of the central axis, the second MTJ element M2, the second CMOS switch T5-T6, and the second select transistor T2 are arranged in this order on the right side of the central axis.

In the third embodiment, the first CMOS switch and the second CMOS switch serve as current suppressing units, and the current suppressing units suppress the current in one of the MTJ elements as a pair, in accordance with the potentials of the pair of bit lines BL and /BL to which the memory cell including the current suppressing units is connected, as in the first embodiment. Furthermore, the current suppressing units can switch operation between a read operation and a write operation, in accordance with the potential of the write enable line WE to which the memory cell including the current suppressing units is connected.

The third embodiment can also prevent a wrong write during a read operation. To maintain symmetry in each operation, however, the components of each memory cell are preferably arranged symmetrically about the central axis.

Fourth Embodiment

Figure 20:
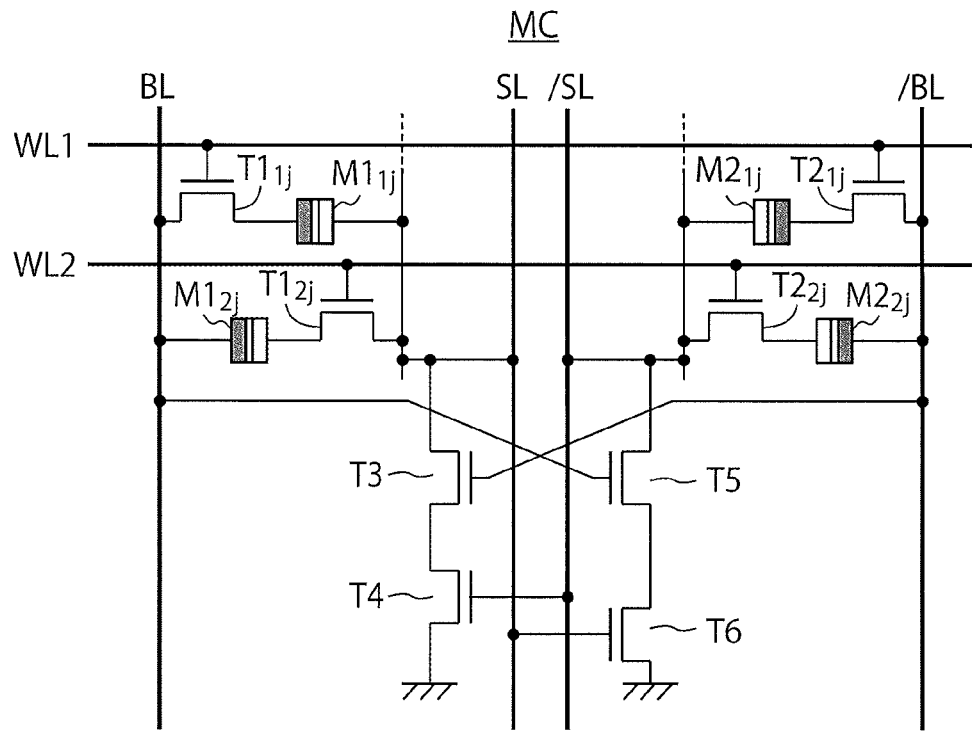
FIG. 20 is a circuit diagram showing a memory cell of a nonvolatile memory according to a fourth embodiment.

Referring now to FIG. 20, a nonvolatile memory according to a fourth embodiment is described. The nonvolatile memory of the fourth embodiment includes memory cells arranged in a matrix fashion, and each of the memory cells has the structure shown in FIG. 20. As shown in FIG. 20, in the fourth embodiment, each memory cell MC has a structure in which the components are arranged symmetrically about the central axis. However, unlike the memory cell MC of the second embodiment shown in FIG. 18, each memory cell has a structure in which the arrangement sequence of the select transistors and the MTJ elements is the reverse of the arrangement sequence in a memory cell located in an adjacent row. For example, as shown in FIG. 20, in the memory cell MC in the first row and the jth (j=1, . . . ) column, the first MTJ element $M1_{1j}$ and the first select transistor $T1_{1j}$ are arranged in this order on the left side of the central axis, and the second MTJ element $M2_{1j}$ and the second select transistor $T2_{1j}$ are arranged in this order on the right side of the central axis. In the memory cell MC in the second row and the jth (j=1, . . . ) column, on the other hand, the first select transistor $T1_{2j}$ and the first MTJ element $M1_{2j}$ are arranged in this order on the left side of the central axis, and the second select transistor $T2_{2j}$ and the second MTJ element $M2_{2j}$ are arranged in this order on the right side of the central axis.

With this arrangement, the source lines SL and /SL and the bit lines BL and /BL have the same capacitances, which is preferable.

In the fourth embodiment, a first current suppressing path formed with the n-channel MOS transistors T3 and T4 connected in series, and a second current suppressing path formed with the n-channel MOS transistors T5 and T6 serve as current suppressing units, and the current suppressing units suppress the current in one of the MTJ elements as a pair, in accordance with the potentials of the pair of bit lines BL and /BL to which the memory cell including the current suppressing units is connected, as in the second embodiment.

Furthermore, the current suppressing units can switch operation between a read operation and a write operation, in accordance with the potentials of the pair of source lines SL and /SL to which the memory cell including the current suppressing units is connected.

The fourth embodiment can also prevent a wrong write during a read operation.

This configuration in which the arrangement sequence of the select transistors and the MTJ elements in a memory cell is the reverse of the arrangement sequence in a memory cell in an adjacent row as in the fourth embodiment may be applied to the eighth modification of the first embodiment shown in FIG. 11.

Fifth Embodiment

Figure 21:
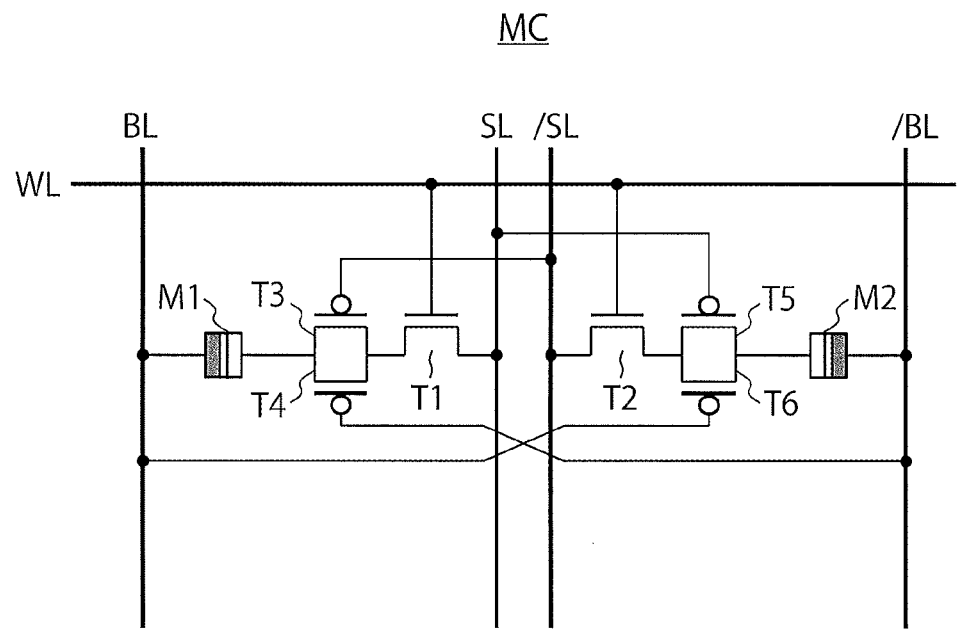
FIG. 21 is a circuit diagram showing a memory cell of a nonvolatile memory according to a fifth embodiment.

Referring now to FIG. 21, a nonvolatile memory according to a fifth embodiment is described. The nonvolatile memory of the fifth embodiment includes memory cells arranged in a matrix fashion, and each of the memory cells has the structure shown in FIG. 21. A memory cell MC of the fifth embodiment is the same as the memory cell of the first embodiment shown in FIG. 1, except that the n-channel MOS transistors T3 and T5 are replaced with p-channel MOS transistors T3 and T5, and the write enable line WE is replaced with a source line /SL. Specifically, a first switch formed with the p-channel MOS transistors T3 and T4, and a second switch formed with the p-channel MOS transistors T5 and T6 serve as current suppressing units as in the first embodiment, and the current suppressing units suppress the current in one of the MTJ elements as a pair, in accordance with the potentials of the pair of bit lines BL and /BL to which the memory cell including the current suppressing units is connected.

(Read Operation)

Figure 22:
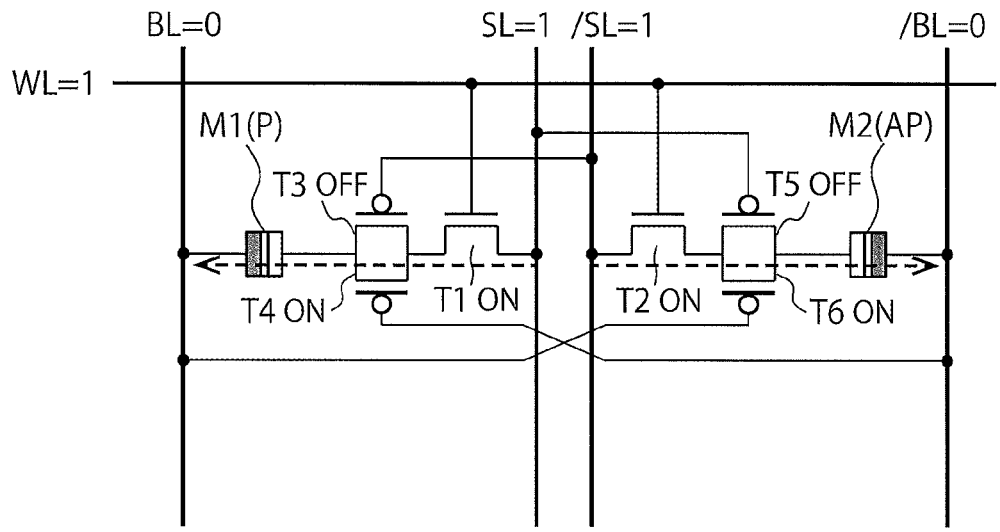
FIGS. 22 and 23 are diagrams for explaining a read operation of the nonvolatile memory according to the fifth embodiment.
Figure 23:
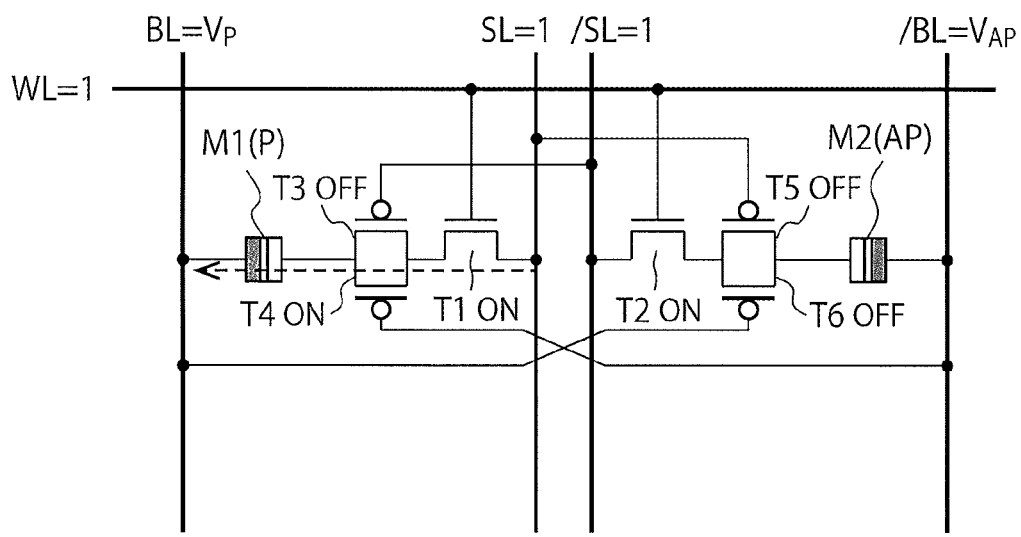

Referring now to FIGS. 22 and 23, a read operation of the nonvolatile memory according to the fifth embodiment is described.

As shown in FIG. 22, in this example case, the magnetization directions of the storage layer and the reference layer of the first MTJ element M1 are in a parallel state, and the magnetization directions of the storage layer and the reference layer of the second MTJ element M2 are in an antiparallel state. First, pre-discharge is performed on the bit lines BL and /BL at the "0" level, and the source lines SL and /SL of the column to which the memory cell MC to be accessed belongs is set at the "H" level ("1" level). The word line WL of the row to which the memory cell MC to be accessed belongs is also set at the "1" level, so that the select transistors T1 and T2 are switched on, and a read current is applied from the source lines SL and /SL to the respective bit lines BL and /BL (FIG. 22). The dashed lines shown in FIG. 22 indicate the read current. Since the resistance values of the first and second MTJ elements M1 and M2 differ from each other at this point, the potential of the bit line BL connected to the first MTJ element M1 in a parallel state increases more quickly than the potential of the bit line /BL. As a result, the potential of the bit line BL exceeds the threshold voltage Vth of the p-channel transistors T4 and T6 before the potential of the bit line /BL connected to the second MTJ element M2 in an antiparallel state does. After the voltage $V_P$ of the bit line BL becomes higher than Vth ($V_P$>Vth), the p-channel MOS transistor T6 is switched off, and the current flowing into the second MTJ element M2 is shut off. At this point, the potential $V_{AP}$ of the bit line /BL is lower than Vth ($V_{AP}$<Vth), and the p-channel MOS transistor T4 remains in an on-state. The potential $V_P$ of the bit line BL is compared with the potential $V_{AP}$ of the bit line /BL, or the current flowing in the bit line BL is compared with the current flowing in the bit line /BL, to read information from the memory cell MC (FIG. 23). It should be noted that the read current is flowing in the current direction to write a parallel state into the first and second MTJ elements M1 and M2. However, the current flowing into the second MTJ element M2 is shut off by the p-channel MOS transistor T6, and thus, a wrong write in the second MTJ element M2 is prevented. Meanwhile, the current flowing into the first MTJ element M1 flows in the direction to store information, and thus, any wrong write does not occur.

In the above described example case, the magnetization directions of the storage layer and the reference layer of the first MTJ element M1 are in a parallel state, and the magnetization directions of the storage layer and the reference layer of the second MTJ element M2 are in an antiparallel state. Also, each of the magnetic layers of the first and second MTJ elements M1 and M2 connected to the bit lines BL and /BL is a fixed layer. In this case, the current flowing into the MTJ element in an antiparallel state, or the second MTJ element, is shut off, and thus, a wrong write in the second MTJ element in an antiparallel state is prevented.

As opposed to the above described case, the magnetization directions of the storage layer and the reference layer of the first MTJ element M1 may be in an antiparallel state, and the magnetization directions of the storage layer and the reference layer of the second MTJ element M2 may be in a parallel state. In such a case, the read current is applied in the same manner as in the case described above with reference to FIG. 22, and a read operation is performed. In this case, the current flowing into the MTJ element in an antiparallel state, or the current flowing into the first MTJ element, is shut off, and thus, a wrong write in the first MTJ element in an antiparallel state is also prevented.

(Write Operation)

Figure 24:
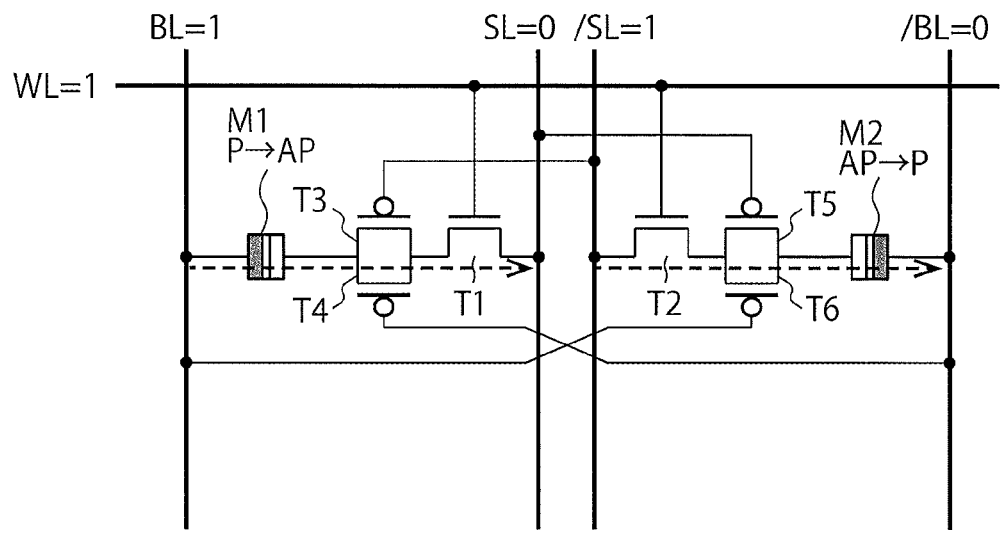
FIG. 24 is a diagram for explaining a write operation of the nonvolatile memory according to the fifth embodiment.

Referring now to FIG. 24, a write operation on a memory cell MC is described. As shown in FIG. 24, in this example case, the magnetization directions of the storage layer and the reference layer of the first MTJ element M1 are also in a parallel state, and the magnetization directions of the storage layer and the reference layer of the second MTJ element M2 are also in an antiparallel state.

First, the word line WL of the row to which the memory cell MC to be accessed belongs is set at the "1" level, the source line SL is set at the "0" level, and the source line /SL is set at the "1" level. The bit line BL is fixed at the "1" level, and the bit line /BL is fixed at the "0" level. Since the p-channel MOS transistors T3 and T6 are in an off-state, and the p-channel MOS transistors T4 and T5 are in an on-state at this point, current flows in the direction to write an antiparallel state into the first MTJ element M1, and current flows in the direction to write a parallel state into the second MTJ element M2. As a result, the information in the memory cell MC is reversed (FIG. 24). If the voltages to be applied to the bit line BL and the bit line /BL are reversed, the first and second MTJ elements can switch magnetization configurations with each other.

The current suppressing units formed with the first switch and the second switch can switch operation between a read operation and a write operation, in accordance with the potential of the source line SL to which the memory cell including the current suppressing units is connected.

In the fifth embodiment, n-channel MOS transistors are used as the first and second select transistors T1 and T2. In a modification of the fifth embodiment, however, the first and second select transistors T1 and T2 may be replaced with p-channel MOS transistors. In that case, the logic of the word line is the reverse of that of the fifth embodiment.

In the fifth embodiment, the arrangement sequence of the first MTJ element, the first switch, and the first select transistor T1, and the arrangement sequence of the second MTJ element, the second switch, and the second select transistor T2 can also be changed as described above in the respective modifications of the first embodiment. For example, in FIG. 21, the first switch formed with the p-channel MOS transistors T3 and T4 may switch positions with the first select transistor T1, and the second switch formed with the p-channel MOS transistors T5 and T6 may switch positions with the second select transistor T2. In that case, the memory cells arranged in one column may share a first switch and a second switch. With such arrangement, a nonvolatile memory like the one shown in FIG. 18 or 20 can be obtained. It should be noted that, in FIGS. 18 and 20, the transistors forming the first and second switches are n-channel MOS transistors.

Like the first embodiment, the fifth embodiment and the modification thereof can prevent a wrong write during a read operation.

Sixth Embodiment

Figure 25:
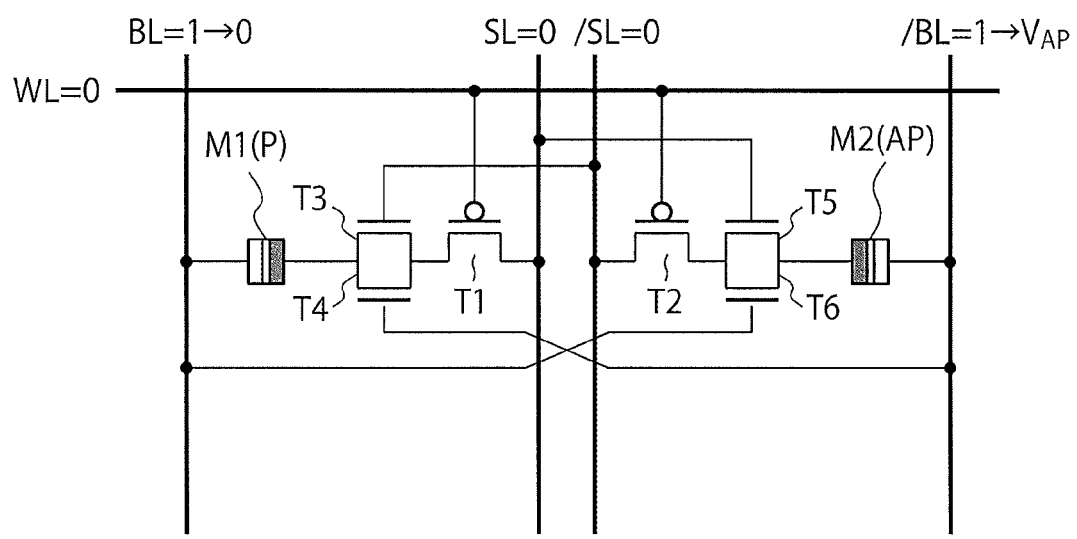
FIG. 25 is a circuit diagram showing a memory cell of a nonvolatile memory according to a sixth embodiment.

Referring now to FIG. 25, a nonvolatile memory according to a sixth embodiment is described. The nonvolatile memory of the sixth embodiment includes memory cells arranged in a matrix fashion, and each of the memory cells has the structure shown in FIG. 25. A memory cell MC of the sixth embodiment is the same as the memory cell of the fifth embodiment shown in FIG. 21, except that the p-channel MOS transistors T3 and T5 are replaced with n-channel MOS transistors T3 and T5, and the n-channel MOS transistors T1 and T2 are replaced with p-channel MOS transistors. That is, in the nonvolatile memory of the sixth embodiment, the signal values (logical values) of the respective wiring lines in a read operation are the reverse of those in a read operation in the nonvolatile memory of the fifth embodiment shown in FIG. 21. When a read operation is performed, as shown in FIG. 25, the potential of the bit line BL switches from the "1" level to the "0" level, and the potential of the bit line /BL switches from the "1" level to $V_{AP}$, which has been described in the first embodiment.

In the sixth embodiment, a first switch formed with the n-channel MOS transistors T3 and T4, and a second switch formed with the n-channel MOS transistors T5 and T6 also serve as current suppressing units as in the first embodiment, and the current suppressing units suppress the current in one of the MTJ elements as a pair, in accordance with the potentials of the pair of bit lines BL and /BL to which the memory cell including the current suppressing units is connected. Furthermore, the current suppressing units can switch operation between a read operation and a write operation, in accordance with the potential of the source line SL to which the memory cell including the current suppressing units is connected.

In the sixth embodiment, p-channel MOS transistors are used as the first and second select transistors T1 and T2. In a modification of the sixth embodiment, however, the first and second select transistors T1 and T2 may be replaced with n-channel MOS transistors. In that case, the logic of the word line is the reverse of that of the sixth embodiment.

In the sixth embodiment, the arrangement sequence of the first MTJ element, the first switch, and the first select transistor T1, and the arrangement sequence of the second MTJ element, the second switch, and the second select transistor T2 can also be changed as described above in the respective modifications of the first embodiment.

Like the first or fifth embodiment, the sixth embodiment can prevent a wrong write during a read operation.

As can be seen from the fifth and sixth embodiments, the current suppressing units can be formed only with p-channel MOS transistors or only with n-channel MOS transistors.

This configuration in which the arrangement sequence of the select transistors and the MTJ elements in a memory cell is the reverse of the arrangement sequence in a memory cell in an adjacent row as in the sixth embodiment may be applied to the eighth modification of the first embodiment shown in FIG. 11.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile memory comprising:
   first through fifth wirings; and
   a memory cell including:
      a first circuit including a first magnetoresistive element and a first select transistor, the first magnetoresistive element and the first select transistor being electrically connected in series, the first magnetoresistive element including a first reference layer, a first storage layer, and a first nonmagnetic layer between the first reference layer and the first storage layer;
      a second circuit including a second magnetoresistive element and a second select transistor, the second magnetoresistive element and the second select transistor being electrically connected in series, the second magnetoresistive element including a second reference layer, a second storage layer, and a second nonmagnetic layer between the second reference layer and the second storage layer;
      a third circuit including first and second transistors; and
      a fourth circuit including third and fourth transistors, wherein
   gates of the first and second select transistors are electrically connected to the first wiring,
   one terminal of the first circuit and a gate of one of the third and fourth transistors of the fourth circuit are electrically connected to the second wiring,
   one terminal of the second circuit and a gate of one of the first and second transistors of the third circuit are electrically connected to the third wiring,
   the other terminal of the first circuit and a gate of the other one of the third and fourth transistors of the fourth circuit are electrically connected to the fourth wiring, and
   the other terminal of the second circuit and a gate of the other one of the first and second transistors of the third circuit are electrically connected to the fifth wiring.

2. The memory according to claim 1, wherein
   the third circuit is a first path including the first transistor and the second transistor electrically connected in series, the first path including one terminal electrically connected to the first circuit and including the other terminal electrically connected to a first power supply terminal to be set to a first potential or a second power supply terminal to be set to a second potential lower than the first potential, and
   the fourth circuit is a second path including the third transistor and the fourth transistor electrically connected in series, the second path including one terminal electrically connected to the second circuit and including the other terminal electrically connected to the first power supply terminal or the second power supply terminal.

3. The memory according to claim 2, wherein
   one terminal of the first magnetoresistive element is electrically connected to the second wiring, and
   one terminal of the second magnetoresistive element is electrically connected to the third wiring.

4. The memory according to claim 2, wherein
   one terminal of the first select transistor is electrically connected to the second wiring, and
   one terminal of the second select transistor is electrically connected to the third wiring.

5. The memory according to claim 1, wherein the first through fourth transistors are p-channel transistors, or the first through fourth transistors are n-channel transistors.

6. The memory according to claim 1, wherein the memory cell further includes:
   a fifth circuit electrically connected in parallel to the first circuit, the fifth circuit including a third magnetoresistive element and a third select transistor, the third magnetoresistive element and the third select transistor being electrically connected in series, the third magnetoresistive element including a third reference layer, a third storage layer, and a third nonmagnetic layer between the third reference layer and the third storage layer; and a sixth circuit electrically connected in parallel to the second circuit, the sixth circuit including a fourth magnetoresistive element and a fourth select transistor, the fourth magnetoresistive element and the fourth select transistor being electrically connected in series, the fourth magnetoresistive element including a fourth reference layer, a fourth storage layer, and a fourth nonmagnetic layer between the fourth reference layer and the fourth storage layer.

7. The memory according to claim 6, wherein one terminal of the first select transistor is electrically connected to the second wiring, and one terminal of the second select transistor is electrically connected to the third wiring.

8. A nonvolatile memory comprising:

a plurality of first wirings;

a plurality of second wirings intersecting the first wirings;

a plurality of third wirings intersecting the first wirings;

a plurality of fourth wirings intersecting the first wirings;

a plurality of fifth wirings intersecting the first wirings;

a first circuit including first and second transistors;

a second circuit including third and fourth transistors; and a plurality of memory cells, at least one of the memory cells including:

a third circuit including a first magnetoresistive element and a first select transistor, the first magnetoresistive element and the first select transistor being electrically connected in series, the first magnetoresistive element including a first reference layer, a first storage layer, and a first nonmagnetic layer between the first reference layer and the first storage layer; and a fourth circuit including a second magnetoresistive element and a second select transistor, the second magnetoresistive element and the second select transistor being electrically connected in series, the second magnetoresistive element including a second reference layer, a second storage layer, and a second nonmagnetic layer between the second reference layer and the second storage layer, wherein gates of the first and second select transistors are electrically connected to one of the first wirings, one terminal of the third circuit and a gate of one of the third and fourth transistors of the second circuit are electrically connected to one of the second wirings, one terminal of the fourth circuit and a gate of one of the first and second transistors of the first circuit are electrically connected to one of the third wirings, the other terminal of the third circuit and a gate of the other one of the third and fourth transistors of the second circuit are electrically connected to one of the fourth wirings, and the other terminal of the fourth circuit and a gate of the other one of the first and second transistors of the first circuit are electrically connected to one of the fifth wirings.

9. The memory according to claim 8, wherein the first circuit is a first path including the first transistor and the second transistor electrically connected in series, the first path including one terminal electrically connected to the third circuit and including the other terminal electrically connected to a first power supply terminal to be set to a first potential or a second power supply terminal to be set to a second potential lower than the first potential, and the second circuit is a second path including the third transistor and the fourth transistor electrically connected in series, the second path including one terminal electrically connected to the fourth circuit and including the other terminal electrically connected to the first power supply terminal or the second power supply terminal.

10. The memory according to claim 8, wherein in each of two adjacent memory cells among the memory cells corresponding to one of the second wirings, a sequence of arrangement of the first magnetoresistive element and the first select transistor in a direction from the corresponding second wiring toward the corresponding fourth wiring in the third circuit is the same as a sequence of arrangement of the second magnetoresistive element and the second select transistor in a direction from the corresponding third wiring toward the corresponding fifth wiring in the fourth circuit, and the sequence of arrangement of the first magnetoresistive element and the first select transistor in the direction from the corresponding second wiring toward the corresponding fourth wiring in the third circuit in one of the two memory cells differs from the sequence of arrangement of the first magnetoresistive element and the first select transistor in the direction from the corresponding second wiring toward the corresponding fourth wiring in the third circuit in the other one of the two memory cells.

* * * * *